(12) United States Patent
Reznicek et al.

(10) Patent No.: US 10,672,490 B2
(45) Date of Patent: Jun. 2, 2020

(54) ONE-TIME-PROGRAMMABLE MEMORY IN A HIGH-DENSITY THREE-DIMENSIONAL STRUCTURE

(71) Applicant: International Business Machines Corporation, Armonk, NY (US)

(72) Inventors: Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 15/873,443

(22) Filed: Jan. 17, 2018

(65) Prior Publication Data
US 2019/0221277 A1  Jul. 18, 2019

(51) Int. Cl.
*H01L 21/02* (2006.01)
*G11C 17/16* (2006.01)
(Continued)

(52) U.S. Cl.
CPC ........ *G11C 17/165* (2013.01); *G11C 13/0007* (2013.01); *H01L 21/0245* (2013.01); *H01L 21/0262* (2013.01); *H01L 21/0268* (2013.01); *H01L 21/02532* (2013.01); *H01L 21/02576* (2013.01); *H01L 21/02579* (2013.01); *H01L 21/02686* (2013.01); *H01L 27/1021* (2013.01); *H01L 27/1023* (2013.01); *H01L 27/115* (2013.01); *H01L 27/11206* (2013.01);
(Continued)

(58) Field of Classification Search
CPC ...................................................... G11C 11/36

USPC ...................................... 257/49, 43; 365/175
See application file for complete search history.

(56) References Cited

U.S. PATENT DOCUMENTS

| | | | | |
|---|---|---|---|---|
| 3,872,356 A | * | 3/1975 | Kruger | H01L 27/016 361/766 |
| 4,748,491 A | * | 5/1988 | Takagi | H01L 23/5258 257/538 |

(Continued)

OTHER PUBLICATIONS

M. Johnson et al., "512-Mb PROM with a Three-Dimensional Array of Diode/Antifuse Memory Cells," IEEE Journal Solid-State Circuits, Nov. 2003, pp. 1920-1928, vol. 38, No. 11.

(Continued)

*Primary Examiner* — Sheng-Bai Zhu
(74) *Attorney, Agent, or Firm* — L. Jeffrey Kelly; Ryan, Mason & Lewis, LLP

(57) ABSTRACT

Semiconductor memory devices and methods for manufacturing semiconductor memory devices are provided herein, An example method includes forming a first silicon layer on a bottom conductive layer, transforming the first silicon layer into a first polysilicon layer, forming a second silicon layer stacked on the first polysilicon layer, and a third silicon layer stacked on the second silicon layer, transforming the second and third silicon layers into second and third polysilicon layers, forming an amorphous silicon layer on the third polysilicon layer, forming the amorphous silicon layer into a silicide layer on at least a portion of the third polysilicon layer, depositing an oxide onto at least a portion of the first, second, and third polysilicon layers, selectively trimming the silicide layer, and forming a top conductive layer on at least a portion of the trimmed silicide layer.

13 Claims, 31 Drawing Sheets

(51) Int. Cl.
H01L 27/112 (2006.01)
H01L 27/102 (2006.01)
H01L 27/115 (2017.01)
G11C 13/00 (2006.01)
H01L 27/24 (2006.01)
H01L 45/00 (2006.01)
H01L 27/22 (2006.01)

(52) U.S. Cl.
CPC .............. *H01L 27/22* (2013.01); *H01L 27/24* (2013.01); *H01L 27/2409* (2013.01); *H01L 27/2427* (2013.01); *H01L 27/2463* (2013.01); *H01L 45/04* (2013.01); *H01L 45/1233* (2013.01); *H01L 45/145* (2013.01); *H01L 45/1675* (2013.01)

(56) References Cited

U.S. PATENT DOCUMENTS

| | | | | |
|---|---|---|---|---|
| 5,585,295 | A * | 12/1996 | Wu | H01L 21/28052 |
| | | | | 148/DIG. 1 |
| 5,650,834 | A * | 7/1997 | Nakagawa | G02F 1/136204 |
| | | | | 349/139 |
| 6,358,760 | B1 * | 3/2002 | Huang | H01L 21/32137 |
| | | | | 216/60 |
| 6,589,884 | B1 * | 7/2003 | Torek | H01L 21/28247 |
| | | | | 134/1.3 |
| 6,777,773 | B2 | 8/2004 | Knall | |
| 9,246,089 | B2 | 1/2016 | Herner et al. | |
| 2002/0037654 | A1 * | 3/2002 | Hayashi | H01L 21/32115 |
| | | | | 438/745 |
| 2003/0042628 | A1 * | 3/2003 | Trivedi | H01L 27/11 |
| | | | | 257/412 |
| 2004/0033648 | A1 * | 2/2004 | Matsunaga | H01L 29/458 |
| | | | | 438/154 |
| 2007/0278495 | A1 * | 12/2007 | Kwon | H01L 29/78603 |
| | | | | 257/75 |
| 2009/0111271 | A1 * | 4/2009 | Starzynski | H01L 21/30604 |
| | | | | 438/701 |
| 2009/0168507 | A1 * | 7/2009 | Petti | G11C 11/5692 |
| | | | | 365/175 |
| 2010/0013090 | A1 * | 1/2010 | Gerritsen | H01L 21/823418 |
| | | | | 257/734 |
| 2010/0157710 | A1 * | 6/2010 | Lambertson | G11C 11/36 |
| | | | | 365/218 |
| 2012/0210932 | A1 | 8/2012 | Hekmatshoar-Tabari et al. | |
| 2014/0291734 | A1 * | 10/2014 | Cheng | H01L 21/28 |
| | | | | 257/288 |

OTHER PUBLICATIONS

M. Crowley et al., "512Mb PROM with 8 Layers of Antifuse/Diode Cells," IEEE International Solid-State Circuits Conference (ISSCC), Paper 16.4, Feb. 13, 2003, 10 pages.

V.S.S. Srinivasan, et al., "Punchthrough-Diode-Based Bipolar RRAM Selector by Si Epitaxy," IEEE Electric Device Letters, Oct. 2012, pp. 1396-1398, vol. 33, No. 10.

M.H. Lee, et al., "Reliability of Ambipolar Switching Poly-Si Diodes for Cross-Point Memory Applications," 69th Device Research Conference (DRC), Jun. 20-22, 2011, pp. 89-90.

S.H. Jo, et al., "CMOS Compatible Nanoscale Nonvolatile Resistance Switching Memory," Nano Letters, Feb. 2008, pp. 392-397, vol. 8, No. 2.

Y. Dong, et al., "Si/a-Si Core/Shell Nanowires as Nonvolatile Crossbar Switches," Nano Letters, Feb. 2008, pp. 386-391, vol. 8, No. 2.

Wikipedia, "3D XPoint," https://en.wikipedia.org/wiki/3D_XPoint, Nov. 24, 2017, 3 pages.

Crossbar, "Crossbar ReRAM: Rethinking Simplicity," https://www.crossbar-inc.com/en/technology/reram-overview/, Dec. 1, 2017, 4 pages.

G.W. Burr et al., "Access Devices for 3D Crosspoint Memory," Journal of Vacuum Science & Technology B, Nanotechonology and Microelectronics: Materials, Processing, Measurement, and Phenomena, Jul./Aug. 2014, 23 pages, vol. 32, No. 4.

K. Suga et al., "P-3: The Effect of A Laser Annealing Ambient on the Morphology and TFT Performance of Poly-Si Films," Society for Information Display (SID), Symposium Digest of Technical Papers, May 2000, pp. 534-537, vol. 31, No. 1.

R.F. Wood et al., "Macroscopic Theory of Pulsed-Laser Annealing II. Dopant Diffusion and Segregation," The American Physical Society, Physical Review B, May 15, 1981, pp. 5555-5569, vol. 23, No. 10.

K. Oh et al., "Bottom-Gate ELA Poly-Si TFT for High-Resolution AMOLED Mobile Displays," Society for Information (SID), Symposium Digest of Technical Papers, May 25, 2016, pp. 923-926, vol. 47, No. 1. Display.

Y. Chen et al., "P-4: Fabrication of Extremely Low Roughness Polycrystalline Silicon and Its Correlation to Device Performance," Society for Information Display (SID), Symposium Digest of Technical Papers, May 2003, pp. 216-219, vol. 34, No. 1.

D. Shahrjerdi et al., "Low-Temperature Epitaxy of Compressively Strained Silicon Directly on Silicon Substrates," Journal of Electronic Materials, Mar. 2012, pp. 494-497, vol. 41, No. 3.

F. Carta et al., "Sequential Lateral Solidification of Silicon Thin Films on Cu BEOL-Integrated Wafers for Monolithic 3-D Integration," IEEE Transactions on Electron Devices, Nov. 2015, pp. 3887-3891, vol. 62, No. 11.

* cited by examiner

100

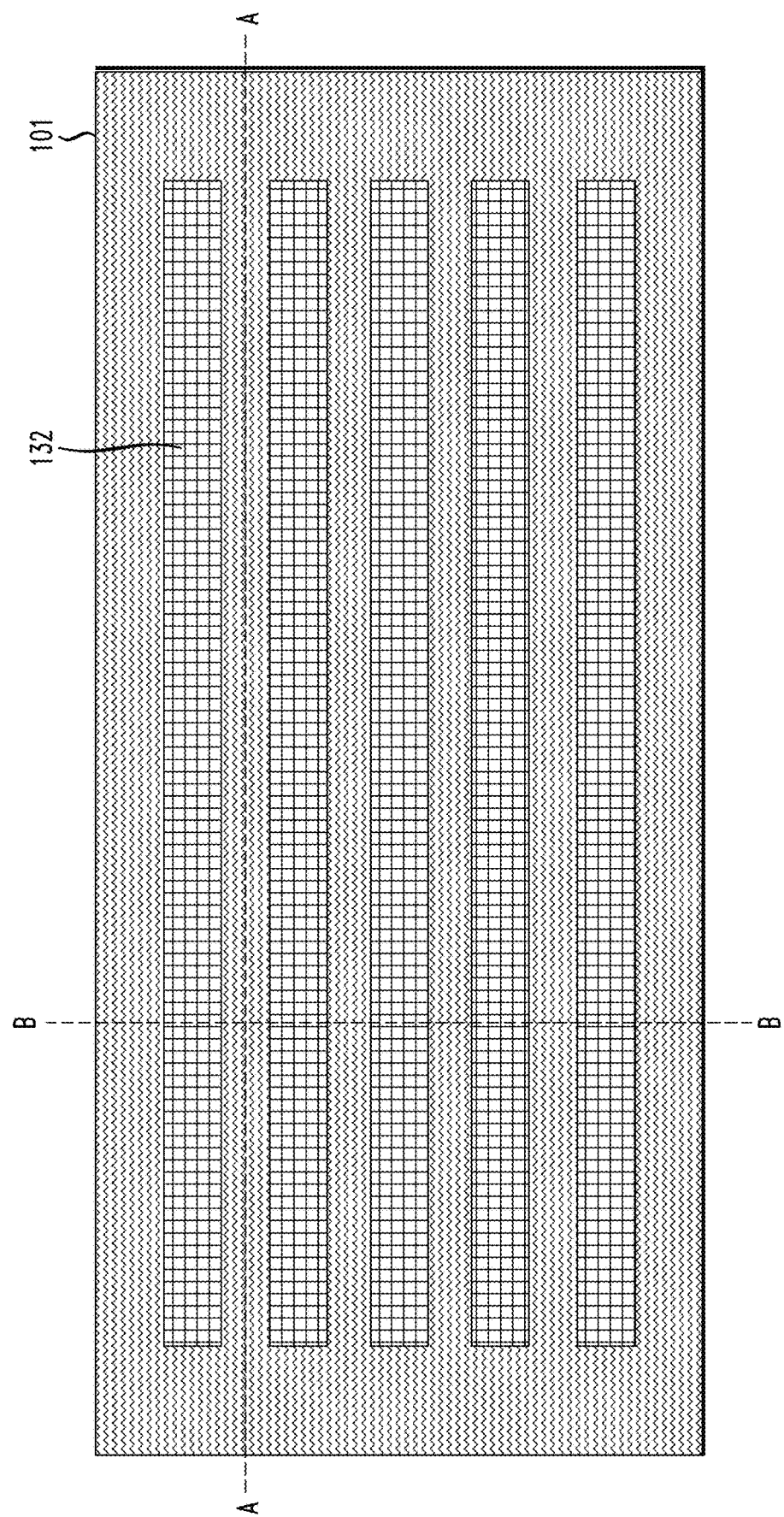

A-A

B-B

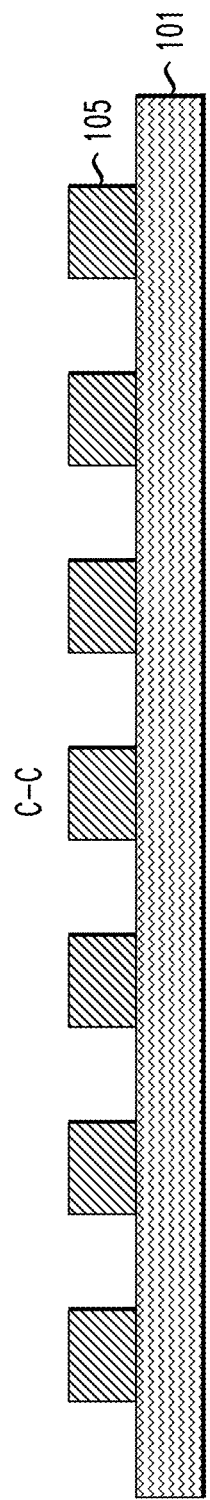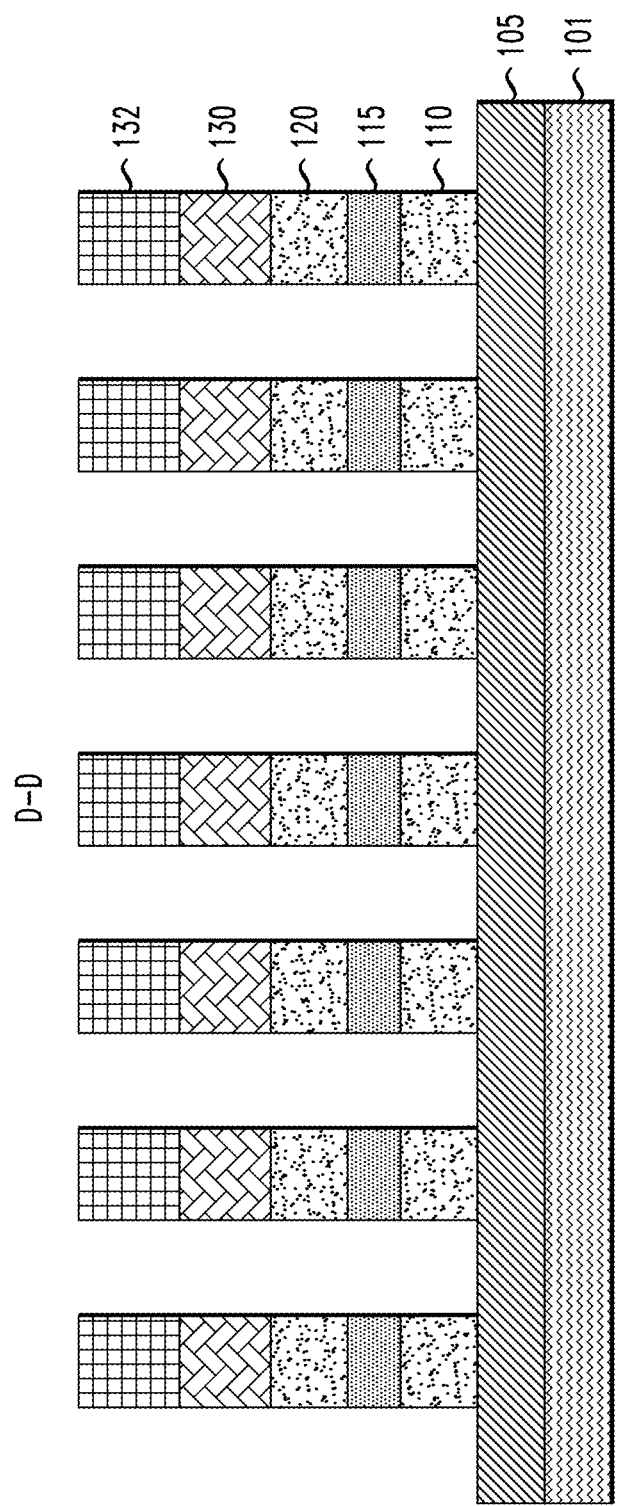

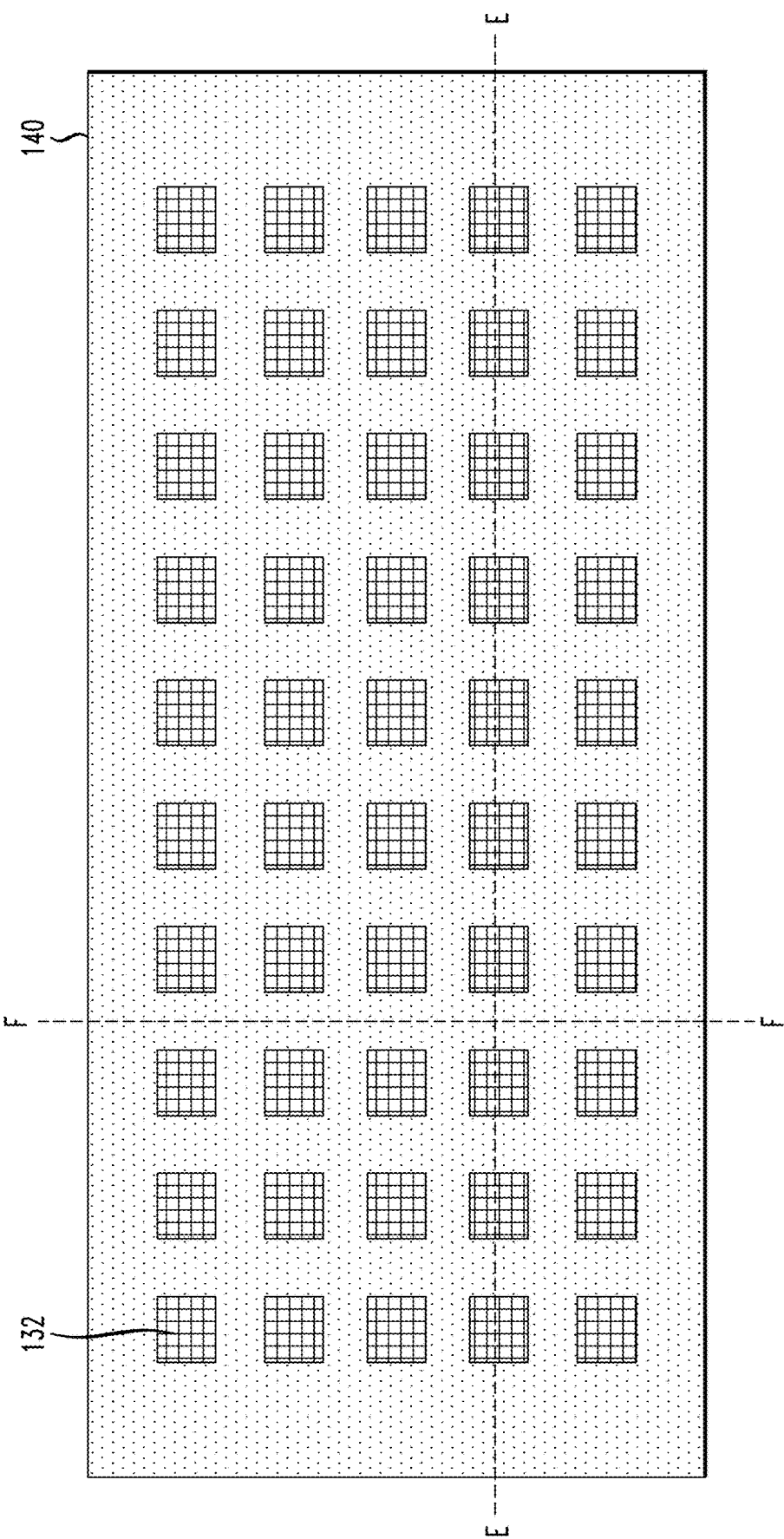

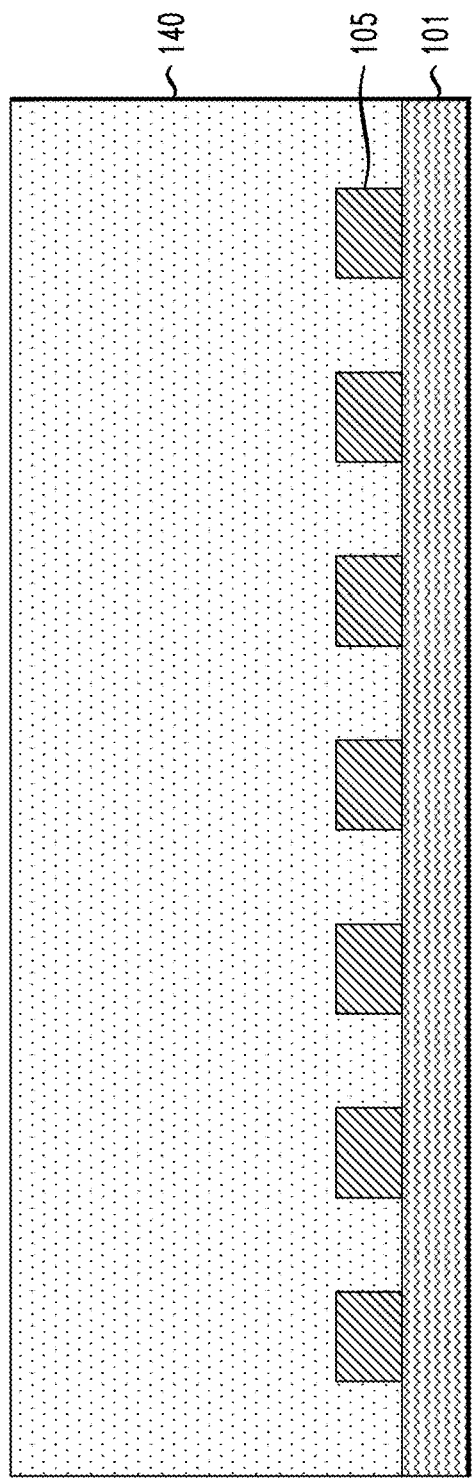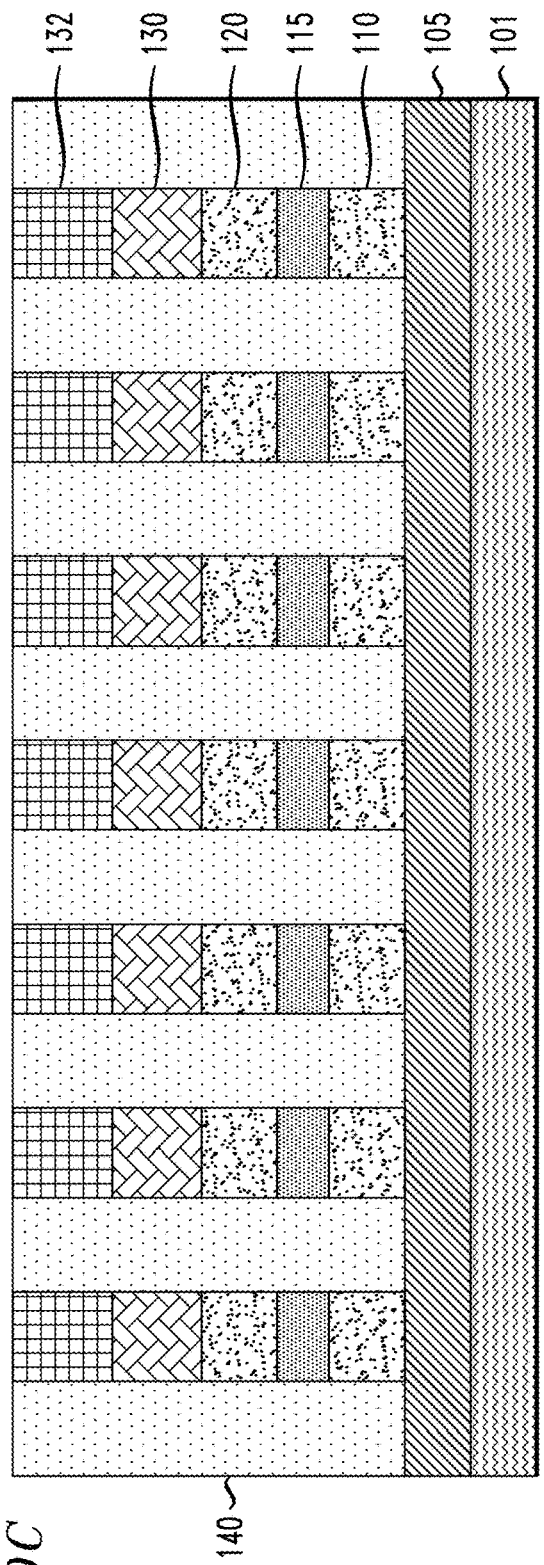

E-E

F-F

E-E

F-F

E-E

F-F

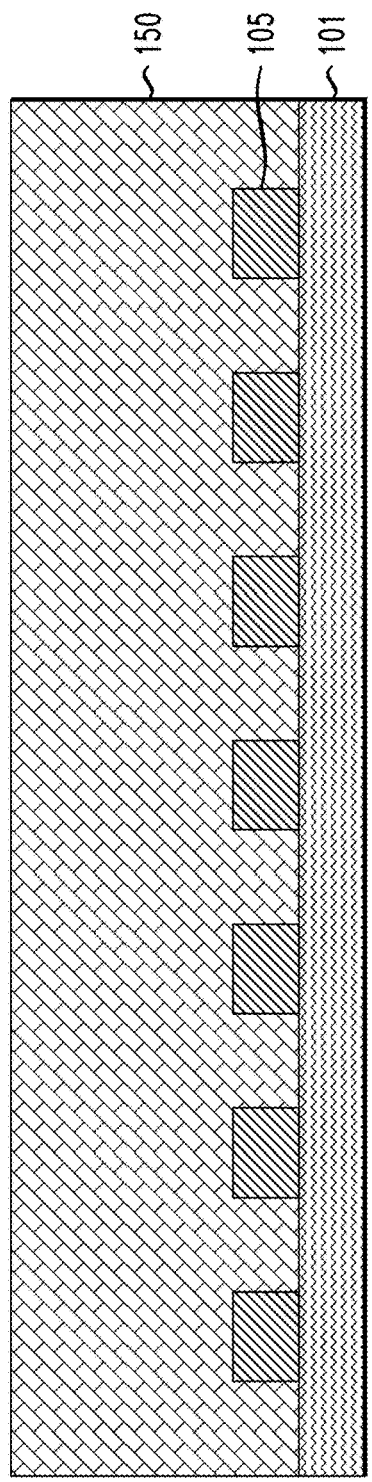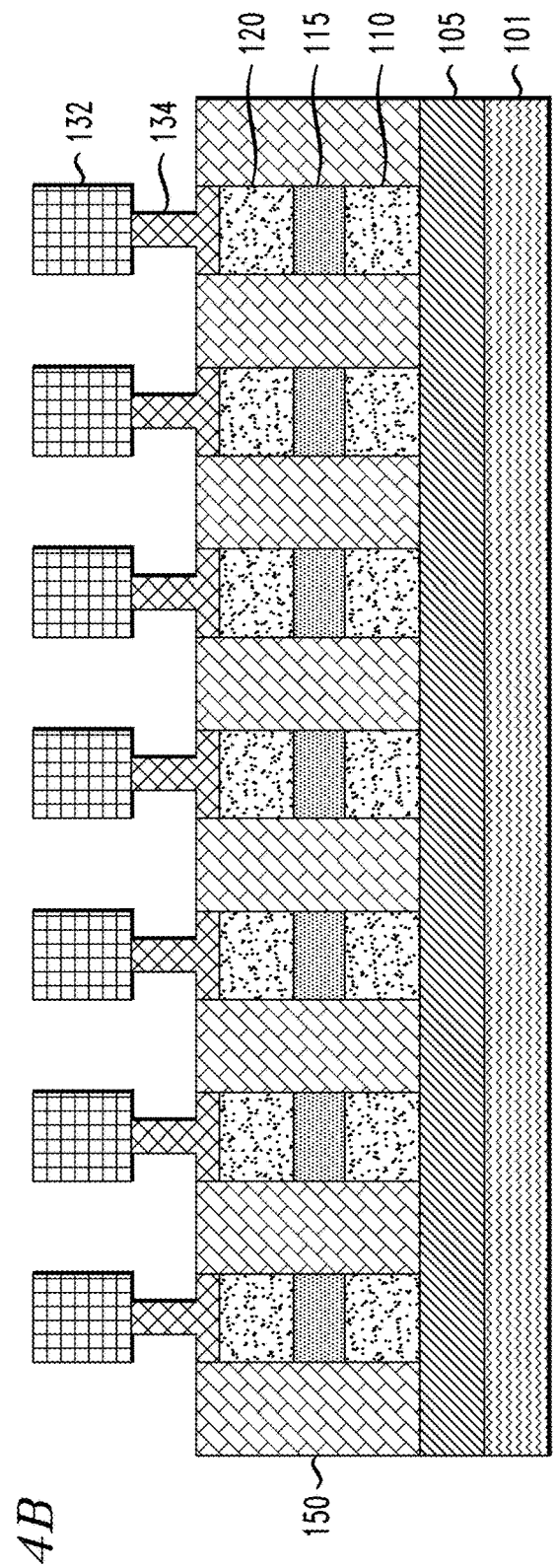

E-E

F-F

G-G

H-H

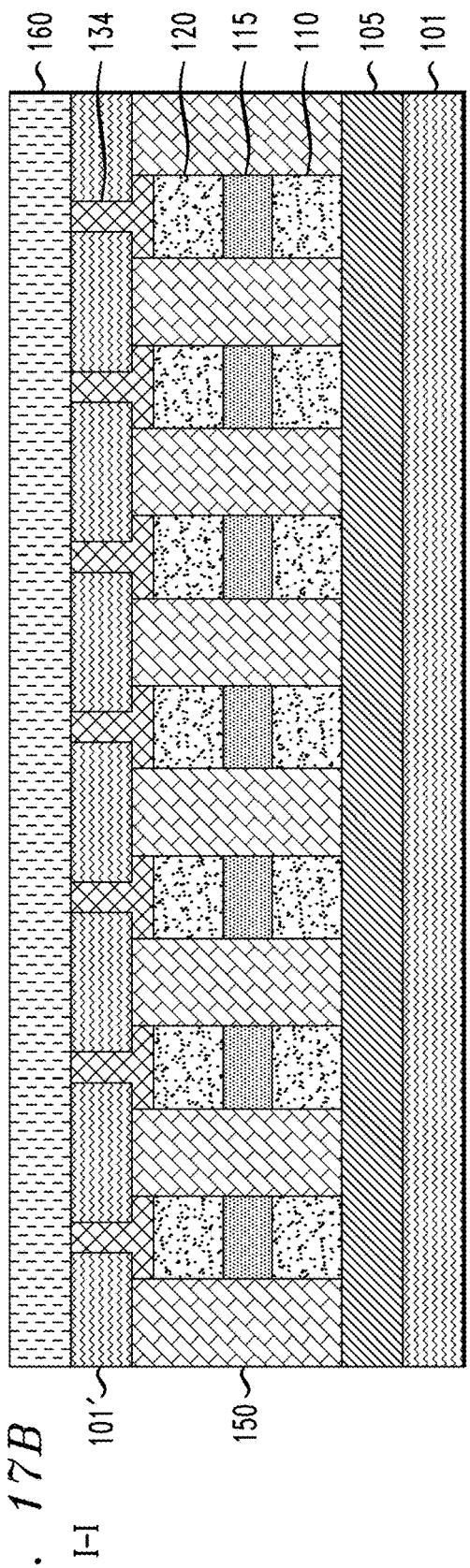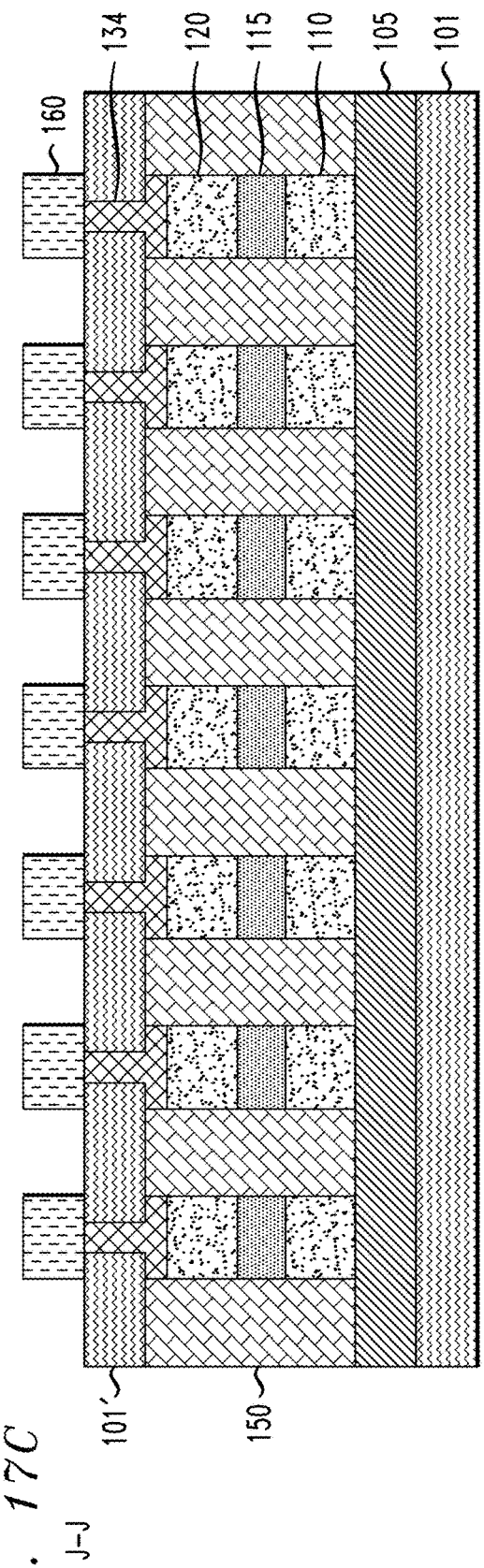

1800

K-K

L-L

K-K

L-L

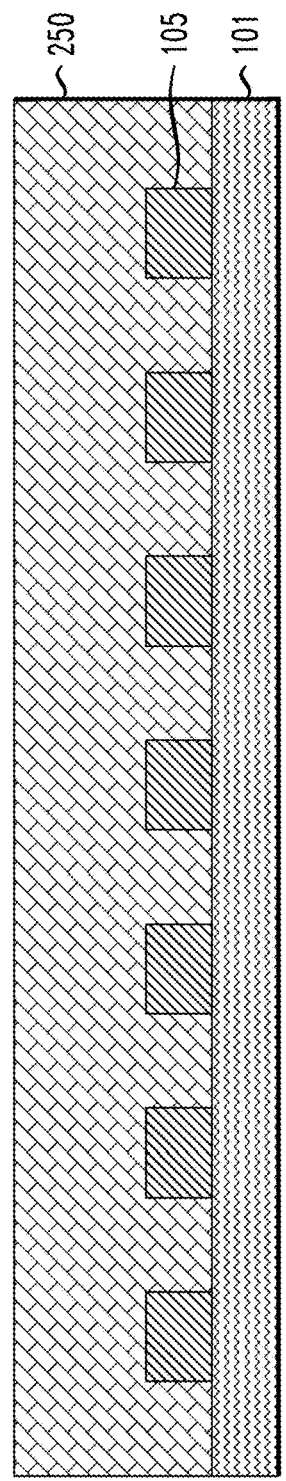
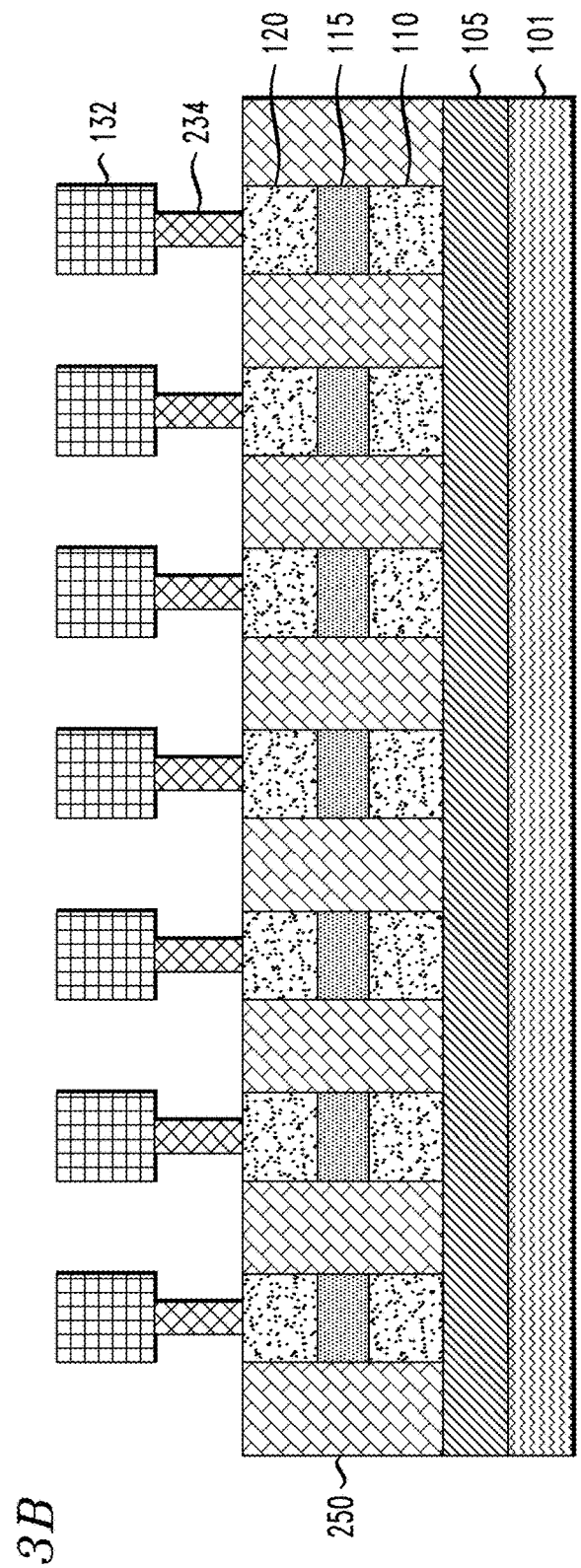
FIG. 23A K-K
FIG. 23B L-L

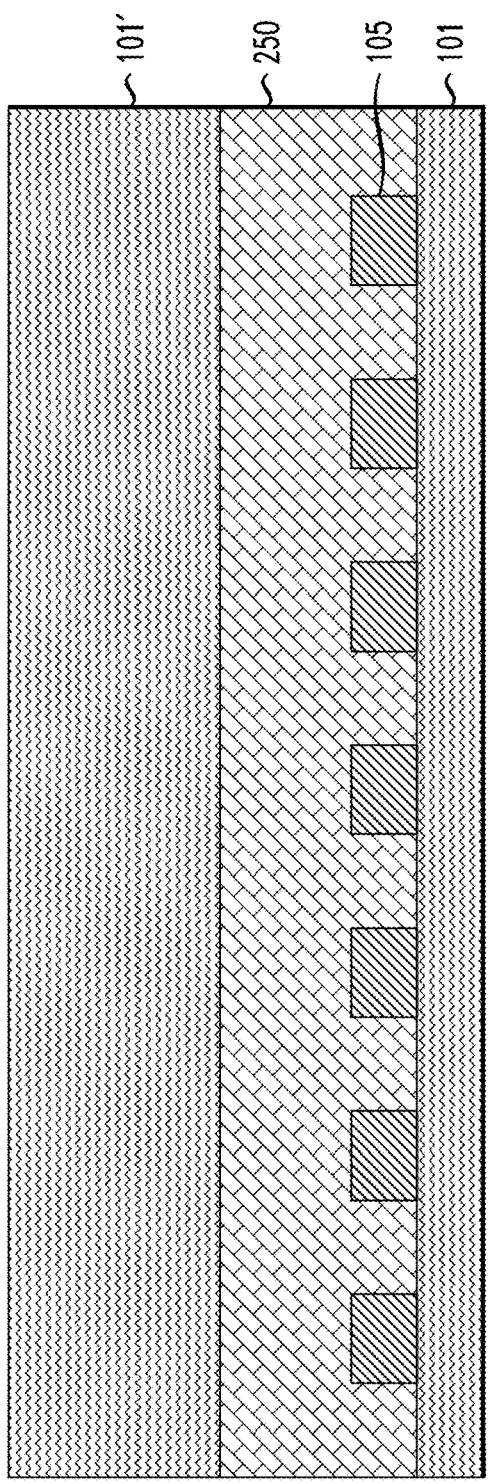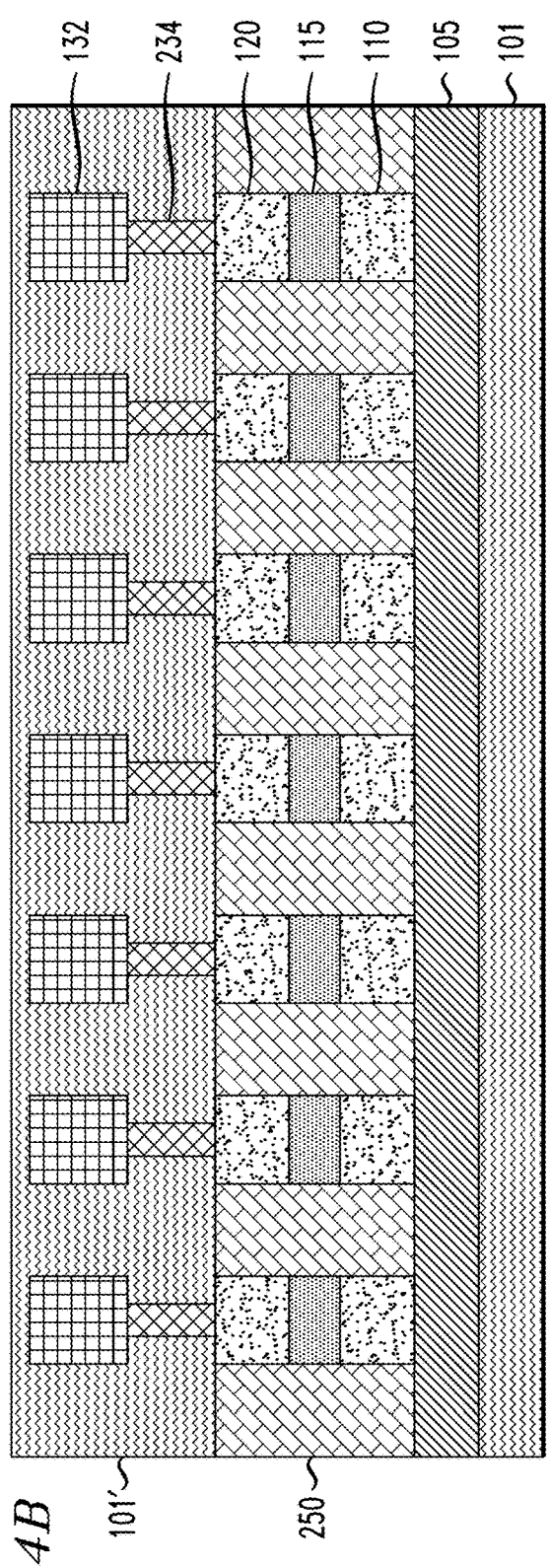

M-M

N-N

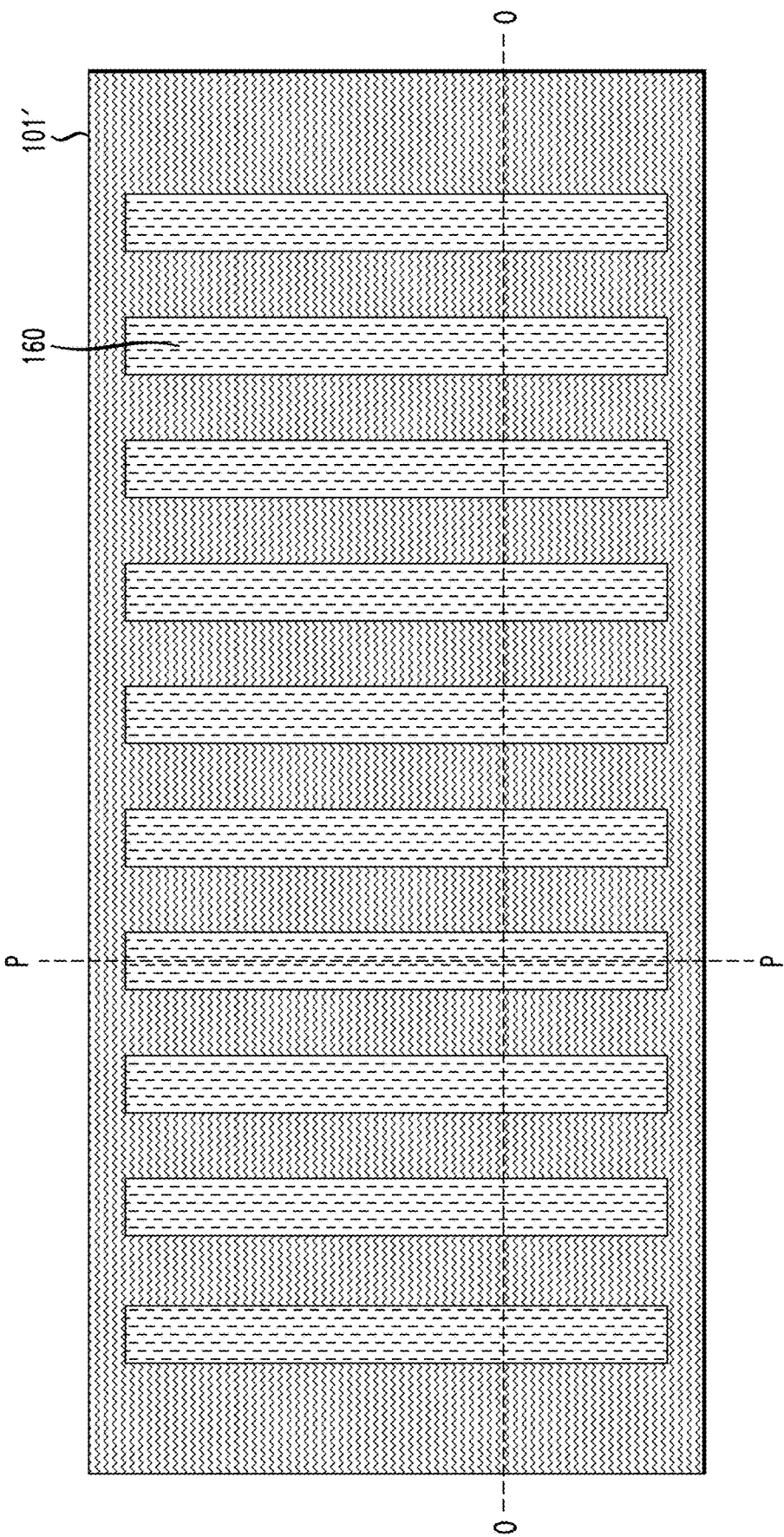

O-O

P-P

ONE-TIME-PROGRAMMABLE MEMORY IN A HIGH-DENSITY THREE-DIMENSIONAL STRUCTURE

BACKGROUND

One-time-programmable (OTP) memory, also known as programmable read-only memory (PROM), employs fuses or anti-fuses for non-volatile digital data storage. Such technology enables entities to maintain a supply of blank PROMs on-hand, and program those blank PROMs on short-notice to avoid large volume commitments. These types of memories are commonly used in microcontrollers, video game consoles, mobile phones, radio-frequency identification (RFID) tags, implantable medical devices, high-definition multimedia interfaces (HDMI), and many other consumer and automotive electronics products.

Additionally, three-dimensional (3D) cross-point architectures can enable high-density OTP memories. Existing OTP technologies include utilizing polysilicon (poly-Si) selection diodes and rupture dielectric layers that function as anti-fuses. However, an issue with these technologies is the resistance variation of the ruptured dielectric (resulting in variation of read current), thus resulting in complex reading circuitry and high power consumption during read operations.

SUMMARY

According to an exemplary embodiment of the present invention, a method for manufacturing a semiconductor device includes forming a first silicon layer on a bottom conductive layer, transforming the first silicon layer into a first polysilicon layer, forming a second silicon layer stacked on the first polysilicon layer, and a third silicon layer stacked on the second silicon layer, transforming the second and third silicon layers into second and third polysilicon layers, wherein the first polysilicon layer has a first doping type, and the third polysilicon layer has a second doping type different from the first doping type, forming an amorphous silicon layer on the third polysilicon layer, forming the amorphous silicon layer into a silicide layer, depositing an oxide onto at least a portion of the first, second, and third polysilicon layers, selectively trimming the silicide layer, and forming a top conductive layer on at least a portion of the trimmed silicide layer.

According to an exemplary embodiment of the present invention, a semiconductor device includes a plurality of word lines spaced apart from each other, a plurality of stacked structures spaced apart from each other and formed on each word line of the plurality of word lines, and a plurality of bit lines spaced apart from each other and formed on the plurality of stacked structures, wherein the plurality of bit lines are oriented perpendicularly with respect to the plurality of word lines. Each of the plurality of stacked structures includes a first polysilicon layer on a word line of the plurality of word lines, a second polysilicon layer on the first polysilicon layer, a third polysilicon layer on the second polysilicon layer, and a silicide layer on at least a portion of the third polysilicon layer, wherein the first polysilicon layer has a first doping type, and the third polysilicon layer has a second doping type different from the first doping type.

According to an exemplary embodiment of the present invention, a method for manufacturing a semiconductor device includes forming a first silicon layer on a bottom conductive layer, transforming the first silicon layer into a first polysilicon layer, forming a second silicon layer stacked on the first polysilicon layer, and a third silicon layer stacked on the second silicon layer, transforming the second and third silicon layers into second and third polysilicon layers, wherein the first polysilicon layer has a first doping type, and the third polysilicon layer has a second doping type different from the first doping type, forming an amorphous silicon layer on the third polysilicon layer, depositing an oxide onto at least a portion of the first, second, and third polysilicon layers, selectively trimming the amorphous silicon layer, forming the trimmed amorphous silicon layer into a silicide layer, depositing an inter-layer dielectric layer onto at least a portion of the silicide layer, and forming a top conductive layer on at least a portion of the inter-layer dielectric layer and at least a portion of the silicide layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 8A is a schematic top view illustrating manufacturing of a memory device and showing patterning of the stacked layers into pillars on the word lines, according to an embodiment of the invention.

FIGS. 9B and 9C are schematic cross-sectional views showing patterning of the nitride hard mask and a-Si/poly-Si, according to an embodiment of the invention.

FIG. 10A is a schematic top view illustrating manufacturing of a memory device and showing deposition of chromium, according to an embodiment of the invention.

FIGS. 10B and 10C are schematic cross-sectional views showing deposition of chromium, according to an embodiment of the invention.

FIGS. 14A and 14B are schematic cross-sectional views showing trimming of chromium silicide (CrSi), according to an embodiment of the invention.

FIGS. 17B and 17C are schematic cross-sectional views showing bit line formation, according to an embodiment of the invention.

FIGS. 23A and 23B are schematic cross-sectional views showing the etching of chromium, according to an embodiment of the invention.

FIGS. 24A and 24B are schematic cross-sectional views showing addition of ILD, according to an embodiment of the invention.

FIG. 26A is a schematic top view illustrating manufacturing of a memory device and showing bit line formation, according to an embodiment of the invention.

DETAILED DESCRIPTION

Figure 1:
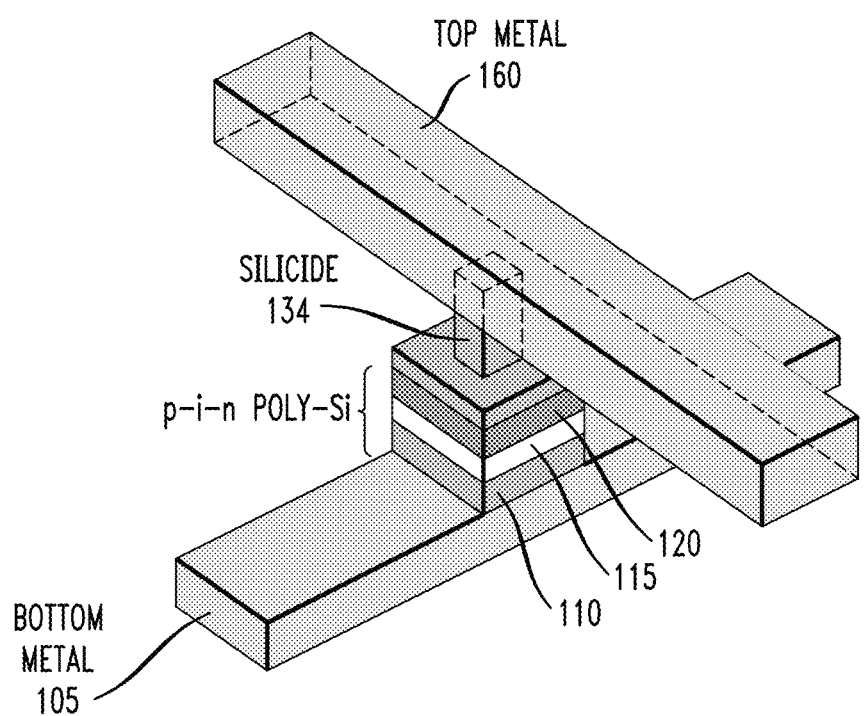
FIG. 1 is a three-dimensional schematic diagram of a memory cell, according to an embodiment of the invention.

Exemplary embodiments of the invention will now be discussed in further detail with regard to semiconductor devices and methods of manufacturing same and, in particular, to techniques for forming OTP memory in a high-density 3D crossbar structure.

It is to be understood that the various layers and/or regions shown in the accompanying drawings are not drawn to scale, and that one or more layers and/or regions of a type commonly used in, for example, phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

As used herein, a "3D cross-point" or "3D cross-bar" structure includes a three-dimensional configuration of memory cells at the intersection of word lines and bit lines. In the structure, each of the memory cells can be addressed individually, so that data can be written and read in small sizes. As described further herein, each memory cell includes a memory element and a selection device, such as, e.g., a diode or OTS. The structures of the memory cells intersecting word lines and bit lines is stacked two or more.

Embodiments of the present invention relate to methods and structures to form OTP memory in a high-density 3D crossbar structure. At least one embodiment of the invention includes generating a 3D stackable high-density OTP cross-point memory with silicide fuses trimmed to have sub-lithographic dimensions. In such an embodiment, selection diodes can have the critical dimension, thus allowing efficient rupture of the trimmed silicide fuses by providing sufficiently high currents. In contrast to existing approaches, the ON state of the OTP in accordance with one or more embodiments of the invention is not achieved by rupture, and therefore, the disadvantageous issues associated with variation of the read current are eliminated.

FIG. 1 is a three-dimensional schematic diagram of a memory cell 100, according to an embodiment of the invention. By way of illustration, FIG. 1 depicts a bottom conductive layer (such as, for example, one or more word lines) 105, a first polysilicon layer 110, a second polysilicon layer 115, a third polysilicon layer 120, a silicide 134 comprised of a trimmed top portion and an untrimmed bottom portion, and a top conductive layer (such as, for example, one or more bit lines) 160. It will be appreciated that the depicted geometry of the trimmed portion of the silicide 134 which has a rectangular cross-section is illustrative and the trimmed portion of the silicide 134 may have a circular cross-section or a rectangular cross-section with rounded edges, in some embodiments. Moreover, the cross-section of the trimmed portion of silicide 134 may vary along its height. For instance, the trimmed portion of silicide 134 may have a smaller cross sectional area at its middle compared to its top and bottom surfaces. As further detailed below, FIGS. 2-17 depict an example method of forming a plurality of memory cells 100.

Figure 2:
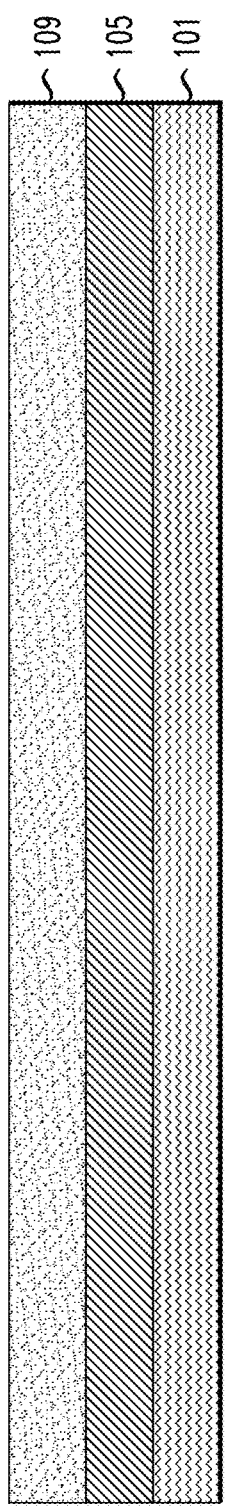
FIG. 2 is a schematic cross-sectional view illustrating manufacturing of a memory device and showing formation of highly doped amorphous silicon (a-Si) on a substrate, according to an embodiment of the invention.

FIG. 2 is a schematic cross-sectional view illustrating manufacturing of a memory device and showing formation of highly doped amorphous silicon (a-Si) on a substrate, according to an embodiment of the invention. By way of illustration, FIG. 2 depicts an ILD layer 101, a word line layer 105, and a highly doped a-Si layer 109. The material of dielectric layer 101 can include, but is not necessarily limited to, a low-K dielectric material, such as, for example, silicon oxide, silicon nitride, silicon oxynitride, boron nitride, and/or silicon boron nitride. The dielectric layer 101 is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, which may be followed by a planarization process, such as, chemical mechanical polishing (CMP), to remove excess portions of the layer 101 after deposition.

The material of the word lines 105 can include an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The word lines 105 can be deposited using, for example, CVD, PECVD, RFCVD, PVD, ALD, MLD, MBD, PLD, LSMCD, and/or sputtering, followed by planarization by, for example, CMP. The word lines 105 can be patterned to be spaced apart from each other, using, for example, photolithography and reactive ion etching (ME) which may optionally include a dielectric hard mask such as oxide or nitride.

Referring to FIG. 2, the highly doped a-Si layer 109 is formed on the word lines 105 (which is formed on the dielectric layer 101). In accordance with an embodiment of the invention, the a-Si layer 109 is $p^{++}$ doped (or $p^+$ doped), and is doped with, for example, boron (B) at a total (i.e. active and/or inactive) concentration in the general range of $10^{20}/cm^3$-$10^{21}/cm^3$. A thickness (e.g., height with respect to the underlying layer) of the highly doped a-Si layer 109 can be approximately 5 nanometers (nm)-25 nm, but thinner or thicker layers may be used as well. The a-Si layer can be deposited using, for example, CVD, PECVD, RFCVD, hot-wire CVD (HWCVD), PVD, ALD, MLD, MBD, PLD, LSMCD, and/or sputtering. The percentage of the active doping concentration in a-Si may be, for example, in the range of 1-10%. The a-Si layer may be doped in-situ during deposition (e.g. with dopant gases introduced in the gas mixture in CVD-based techniques, or using a doped solid target in PVD-based techniques) or introduced after deposition, e.g. using ion-implantation. The a-Si films may contain elements such as, e.g. hydrogen (H), helium (He), argon (Ar), nitrogen (N), germanium (Ge) and carbon (C) which may be incorporated into the film, e.g. from precursor gases and/or carrier gases during growth.

Figure 3:
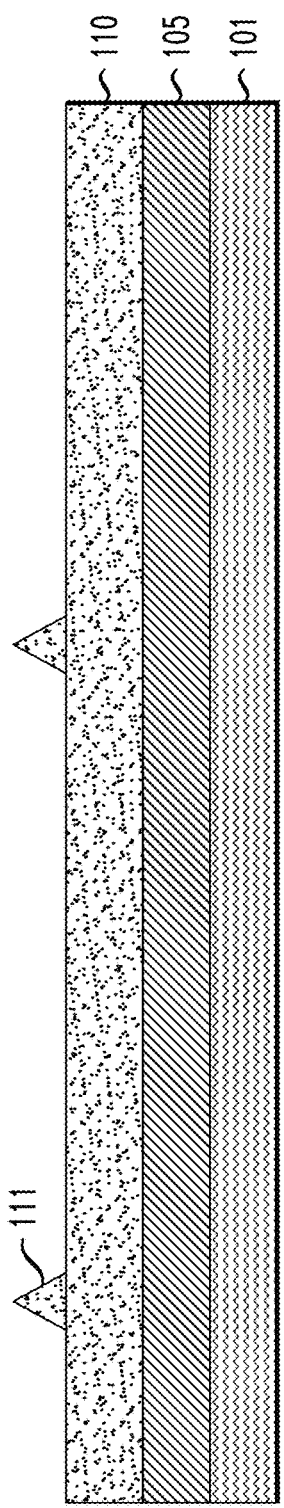
FIG. 3 is a schematic cross-sectional view illustrating manufacturing of a memory device and showing transformation of the highly doped a-Si to polysilicon, according to an embodiment of the invention.

FIG. 3 is a schematic cross-sectional view illustrating manufacturing of a memory device and showing transformation of the highly doped a-Si to polysilicon, according to an embodiment of the invention. As depicted in FIG. 3, the doped a-Si layer 109 is crystallized into a polysilicon layer 110 using, for example, laser crystallization, such as ELA, which can be performed at a temperature of less than ~400° C. Laser pulses with short durations generate local heat which may be efficiently dissipated, allowing to maintain the substrate at temperatures as low as room temperature (or lower than room temperature if substrate cooling is used). The polysilicon layer 110 has the same doping type and about the same doping concentration as the a-Si layer 109. A small portion of dopant species may escape from the surface in gaseous form during crystallization; however, the percentage of active doping may substantially improve after crystallization, e.g., from 1-10% to over 95%. During the laser annealing process, surface protrusions 111 (also referred to as surface spikes) may be formed on the surface of the resulting polysilicon layer 110. Some preparation methods and/or conditions (e.g., one-shot ELA), may result in surface protrusions at grain-boundary locations.

In one example, the excimer laser energy density (fluence) is in the range of 350 mJ/cm$^2$-450 mJ/cm$^2$, the laser pulse width is in the range of 10 ns-50 ns and the repetition rate is in the range of 100 Hz-1 KHz. The number of laser pulses (shots) may be in range of 1-100, but a larger number of pulses may also be used. Other laser crystallization techniques known in the art, such as sequential lateral solidification (SLC) may also be used. In embodiments where a-Si contains volatile elements, such as H, Ar and He, a low-temperature thermal treatment (e.g. furnace anneal at 400° C.) or low-energy laser treatment (e.g. with fluence below 300 mJ/cm$^2$) may be performed before laser crystallization to substantially reduce the concentration of the volatile elements (e.g. to lower than 1%) in order to avoid explosive release of these elements (and therefore formation of voids) during laser crystallization.

Figure 4:
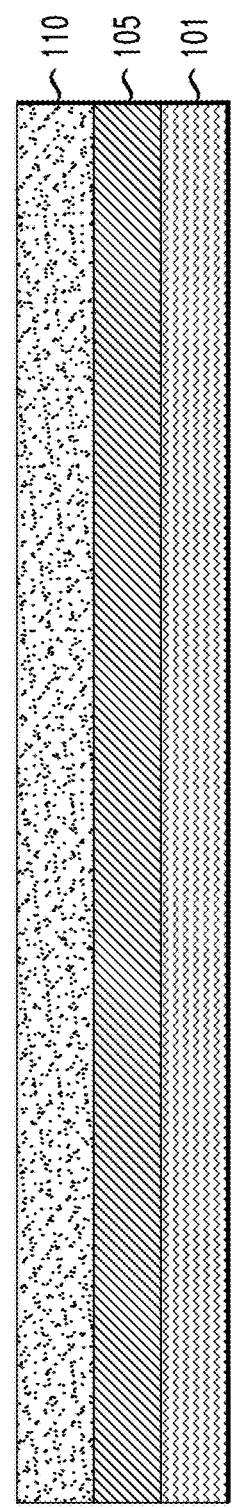
FIG. 4 is a schematic cross-sectional view illustrating manufacturing of a memory device and showing removal of surface spikes formed as a result of the transformation of the highly doped a-Si to polysilicon, according to an embodiment of the invention.

FIG. 4 is a schematic cross-sectional view illustrating manufacturing of a memory device and showing removal of surface spikes formed as a result of the transformation of the highly doped a-Si to polysilicon, according to an embodiment of the invention. As depicted in FIG. 4, the surface protrusions 111 may be removed, using chemical and/or mechanical methods, such as, for example, CMP.

Figure 5:
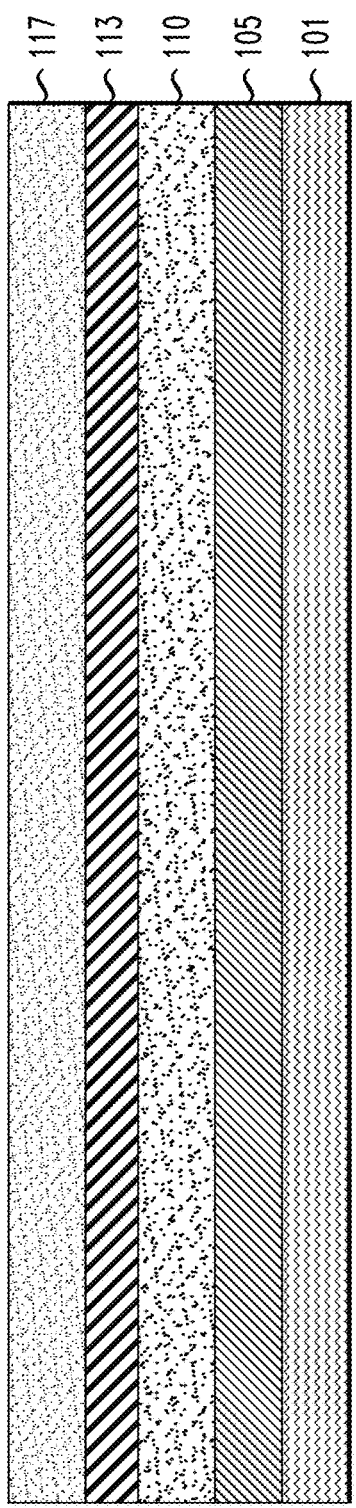
FIG. 5 is a schematic cross-sectional view illustrating manufacturing of a memory device and showing formation of layers of intrinsic and highly doped silicon, according to an embodiment of the invention.

FIG. 5 is a schematic cross-sectional view illustrating manufacturing of a memory device and showing formation of layers of intrinsic (i) and highly doped silicon, according to an embodiment of the invention. In preferred embodiments, the intrinsic (i) silicon layer is substantially free of dopants; however, is some embodiments, small concentrations of dopants, typically below $10^{17}$ cm$^{-3}$ and more typically below $10^{16}$ cm$^{-3}$ may be present in the i layer (thus forming a lightly-doped layer). FIG. 5 depicts i low-temperature epitaxy and n+ low-temperature epitaxy silicon layers, 113 and 117, respectively, formed on the highly doped polysilicon layer 110. In accordance with at least one embodiment of the invention, i and n$^{++}$ (or n$^+$) polycrystalline Si layers 113 and 117 are grown epitaxially (i.e. following the crystalline structure of the polysilicon layer 110) using low-temperature techniques such as PECVD and HWCVD; or a-Si, nano-crystalline silicon (nc-Si), or microcrystalline silicon (μc-Si) layers 113, 117 are deposited non-epitaxially using techniques, such as, for example, CVD, PECVD, HWCVD, RFCVD, PVD, ALD, MLD, MBD, PLD, LSMCD, and/or sputtering; and converted into polysilicon after deposition, e.g. by laser crystallization. The conversion into polysilicon may be epitaxial (i.e. layers 113 and 117 follow the crystalline structure of the polysilicon layer 110 during crystallization) or may be non-epitaxial (i.e. layers 113 and 117 do not follow the crystalline structure of the polysilicon layer 110 during crystallization).

Low-temperature epitaxial growth of layers 113 and 117 may be performed using plasma-enhanced chemical vapor deposition (PECVD) at temperatures below ~400° C., such as, 150° C.-350° C., in some embodiments. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In a low-temperature epitaxial deposition process, the system parameters are set such that the carrier (e.g. hydrogen) radicals present in the gas mixture selectively remove the weak atomic bonds formed on the growth surface (which would otherwise result in non-crystalline growth) thus resulting in a semiconductor material that has substantially the same crystalline characteristics as the deposition surface on which the epitaxially grown material is formed. In one example, a mixture of SiH$_4$ (silane) and H$_2$ (hydrogen) gases with a gas flow ratio of [H$_2$]/[SiH$_4$]>5 is used for PECVD epitaxy and the resulting epitaxial polysilicon layer contains between 5-40% hydrogen. The system parameters may be set (e.g. [H$_2$]/[SiH$_4$]<5) such that the growth is non-epitaxial, i.e., resulting in hydrogenated a-Si, nc-Si or The epitaxial deposition process may employ the deposition chamber of a plasma-enhanced chemical vapor deposition (PECVD) apparatus where plasma may be generated from a DC source, an RF source or very-high-frequency (VHF) source; or a hot-wire chemical vapor deposition (HWCVD) apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. By "in-situ", it is meant that the dopant that dictates the conductivity type of the doped layer is introduced during the process step, e.g., epitaxial deposition, which forms the doped layer. Dopant gases used for n-type doping may include, e.g., phosphine (PH$_3$) and arsine (AsH$_3$), and the dopant gases used for p-type doping may include, e.g., diborane (B$_2$H$_6$) or trimethylborane (B(CH$_3$)$_3$, also known as TMB).

In accordance with at least one embodiment of the invention, the layer 113 can be substantially free of dopants. Alternatively, instead of i poly-Si, in the case of a lightly doped layer 113 (e.g., n$^-$ or p$^-$), the layer can be doped with arsenic (As) or phosphorous (P) for n$^-$ doping or with boron (B) for p$^-$ doping at a concentration of generally below $10^{17}$/cm$^3$.

The layer 117 can be doped with, for example, boron (B) at a concentration in the general range of $5\times10^{18}$/cm$^3$-$5\times10^{19}$/cm$^3$. As explained herein, a stacked p-i-n structure can be formed. Alternatively, a stacked p-n structure or a Schottky structure may be formed. A Schottky structure is the same as a p-n structure or a p-i-n structure with one of the two doped layers (n or p) omitted. It will be appreciated that, even though bi-directional (bipolar) selection is not required for operation, bi-directional diodes may be utilized by forming a p-n-p or an n-p-n structure, where the doping of layers 113 and 117 is modified accordingly. A thickness (e.g., height with respect to the underlying layer) of each of layers 113 and 117 can be approximately 3-15 nm, but thicker or thinner layers may be used as well.

Figure 6:
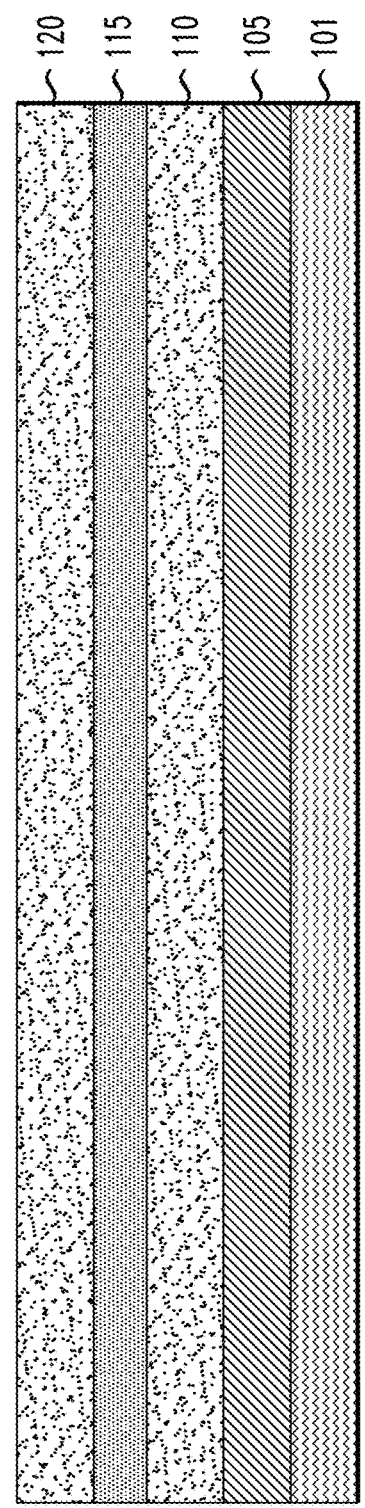
FIG. 6 is a schematic cross-sectional view illustrating manufacturing of a memory device and showing transformation of the layers of intrinsic and highly doped Si to polysilicon, according to an embodiment of the invention.

FIG. 6 is a schematic cross-sectional view illustrating manufacturing of a memory device and showing transformation of the layers of intrinsic and highly doped Si to polysilicon, according to an embodiment of the invention. As depicted in FIG. 6, a-Si, nano-crystalline silicon (nc-Si), or micro-crystalline silicon (μc-Si) layers 113 and 117 are crystallized to result in doped polysilicon layers 115 and 120. Similar to what is described in connection with FIG. 3, laser crystallization, such as ELA, which can be performed at a temperature of less than 400° C. to transform the layers 113 and 117 into polysilicon layers 115 and 120. The polysilicon layers 115 and 120 have the same doping as the layers 113 and 117, respectively, but the doping activation may improve during crystallization. Although not shown, like the surface protrusions 111 discussed in connection with FIG. 3, surface protrusions may be formed on the surface of the resulting polysilicon layer 120 as a result of a laser annealing process, which can be removed using chemical and/or mechanical methods, such as, for example, CMP.

In embodiments where layers 113 and 117 are grown epitaxially and therefore are polycrystalline after growth, a laser treatment step may be optionally performed to improve the crystallinity (e.g. reduce the crystal defects) and/or increase doping activation in layers 113 and 117. Other treatments generally known to improve crystallinity, increase doping activation and/or passivate dangling bonds, such as, e.g., rapid thermal annealing (RTA), forming gas anneal (FGA) and flash lamp anneal, may also be optionally used in conjunction with laser crystallization or laser treatment, so far as the treatment temperature is maintained below ~400° C.

Figure 7:
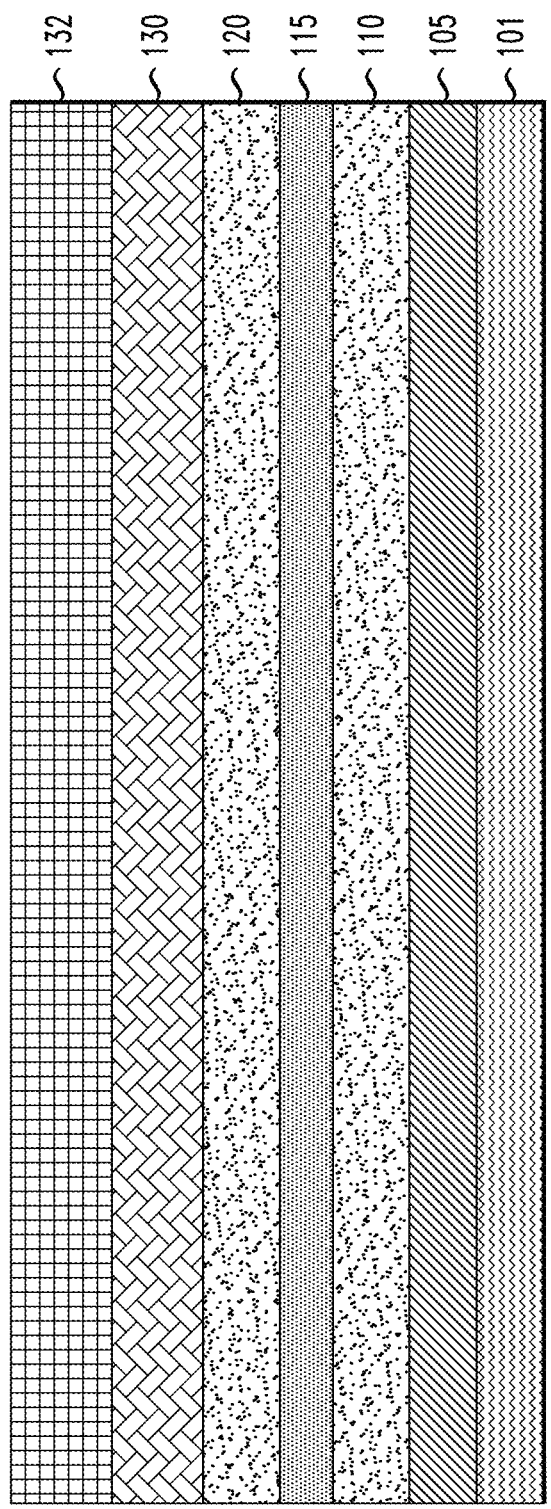
FIG. 7 is a schematic cross-sectional view illustrating manufacturing of a memory device and showing formation of a-Si and a nitride hard mask on the upper polysilicon layer from FIG. 6, according to an embodiment of the invention.

FIG. 7 is a schematic cross-sectional view illustrating manufacturing of a memory device and showing formation of a-Si and a nitride hard mask on the upper polysilicon layer from FIG. 6, according to an embodiment of the invention. As depicted in FIG. 7, an a-Si layer 130 and a nitride hard mask 132 are formed on the upper polysilicon layer 120 of the stack including the polysilicon layers 110, 115 and 120. In accordance with an embodiment of the present invention, a thickness (e.g., height with respect to the underlying layer) of the a-Si layer 130 can be approximately 3-25 nm, but thicker or thinner layers may be used as well. The a-Si layer 130 and nitride hard mask 132 can be deposited using, for example CVD, PECVD, RFCVD, HWCVD, PVD, ALD, MLD, MBD, PLD, LSMCD, and/or sputtering. The nitride hard mask 132 can be approximately 3-25 nm, but thicker or thinner layers may be used as well.

Figure 8B:
FIGS. 8B and 8C are schematic cross-sectional views illustrating manufacturing of a memory device and showing patterning of the stacked layers into pillars on the word lines, according to an embodiment of the invention.
Figure 8C:
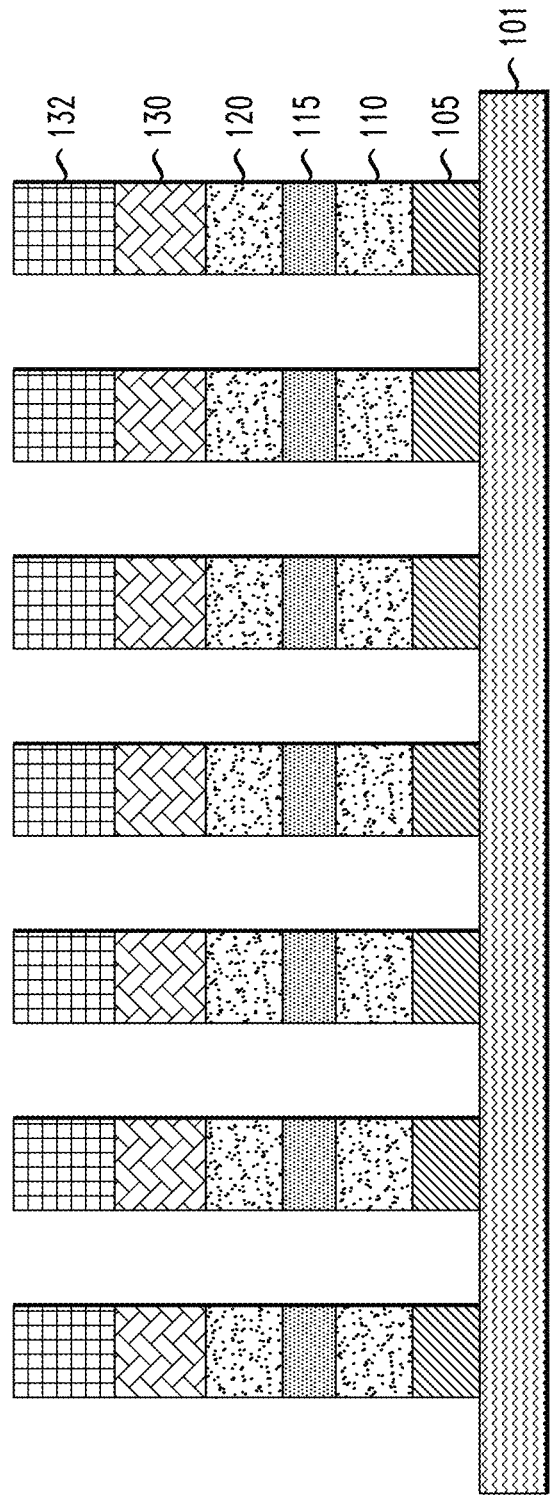

FIG. 8A is a schematic top view and FIGS. 8B and 8C are schematic cross-sectional views illustrating manufacturing of a memory device and showing patterning of the stacked layers into pillars on the word lines, according to an embodiment of the invention. Referring to FIGS. 8A-8C, the stacks including the nitride (SiN) hard mask layer 132 on the a-Si layer 130, on the stacked polysilicon layers 110, 115 and 120 are patterned using an etching process, such as, for example, reactive ion etching (RIE) to result in pillar/columnar structures spaced apart from each other on the word lines 105, each columnar structure including layers 132, 130, 120, 115 and 110 in descending order. As can be understood, according to at least one embodiment of the invention, the etch of the nitride mask can be performed using, such as, e.g. a $CF_4/O_2$ plasma, and the etching of the a-Si/polysilicon layers 130/120/115/110 can be performed using, such as, e.g., an $SF_6/O_2$ plasma, $SF_6/CHF_3$ plasma or $CF_4$ plasma, and the hard mask 130 formed on the a-Si layer 130 can mask portions of the stacked structures including layers 130, 120, 115 and 110 not being etched, and expose remaining portions of the stacked structures that are to be etched. The word lines 105 may be patterned using the same or a different etch than that used for the a-Si/polysilicon layers 130/120/115/125. In one example where the word lines 105 are comprised of tungsten (W), the word lines 105 can be patterned using the same etch as that used for the a-Si/polysilicon layers 130/120/115/110, such as, e.g. a $SF_6/CHF_3$ plasma.

Figure 9A:
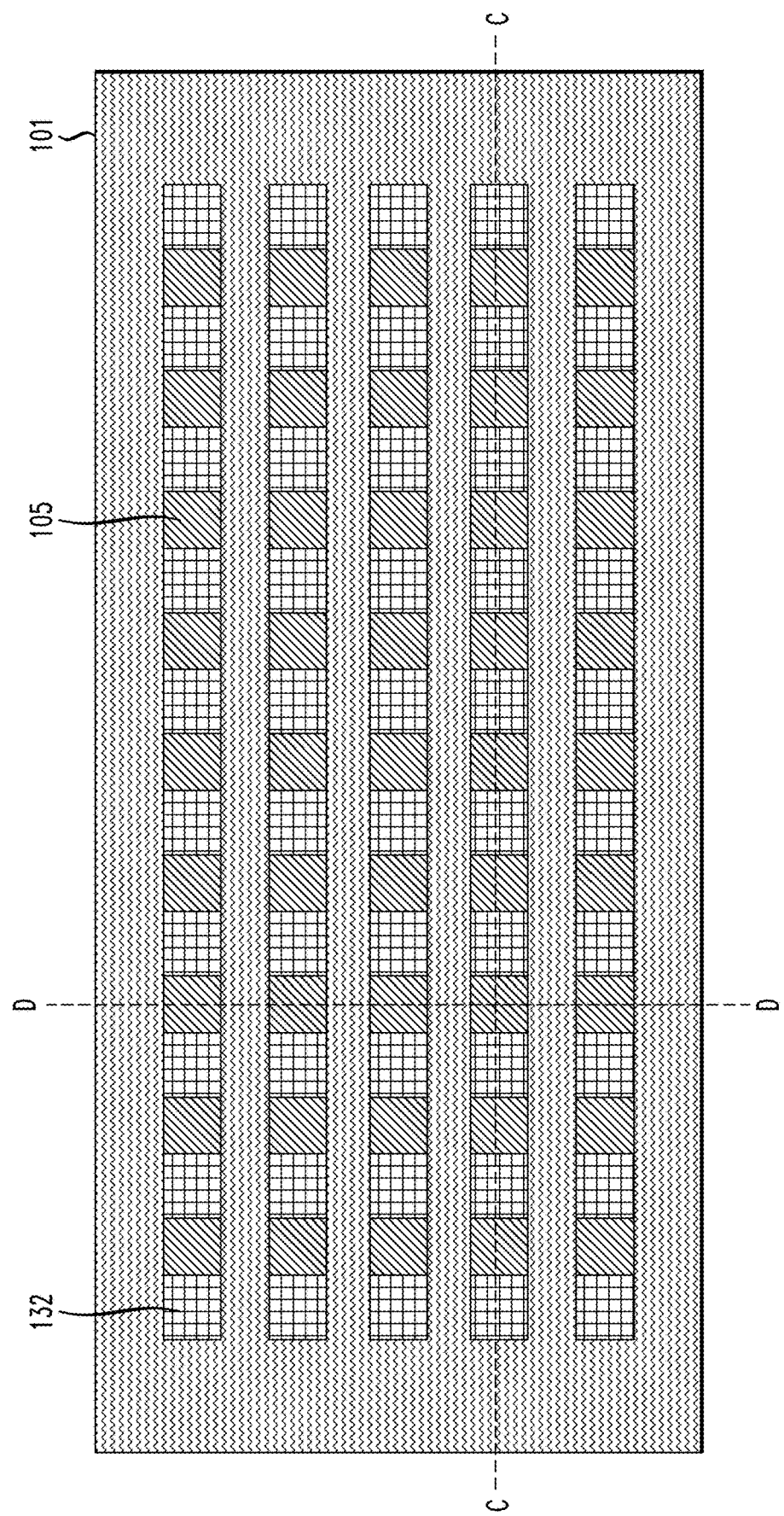
FIG. 9A is a schematic top view illustrating manufacturing of a memory device and showing patterning of the nitride hard mask and a-Si/poly-Si, according to an embodiment of the invention.

FIG. 9A is a schematic top view and FIGS. 9B and 9C are schematic cross-sectional views illustrating manufacturing of a memory device and showing patterning of the nitride hard mask and a-Si/poly-Si, with the etch stopping on the word lines 105, according to an embodiment of the invention. In FIGS. 9A-9C, the nitride hard mask 132 and the a-Si/poly-Si 130/120/115/110 are patterned. In one example, the etch of the nitride mask can be performed using, such as, e.g., a $CF_4/O_2$ plasma, and the etching of the a-Si/polysilicon layers 130/120/115/110 can be performed using, such as, e.g., an $SF_6/O_2$ plasma, $SF_6/CHF_3$ plasma or $CF_4$ plasma.

FIG. 10A is a schematic top view illustrating manufacturing of a memory device and showing deposition of chromium, according to an embodiment of the invention. Also, FIGS. 10B and 10C are schematic cross-sectional views showing deposition of chromium, according to an embodiment of the invention. Referring to FIGS. 10A-10C, the deposition of chromium 140 can be performed using deposition techniques, such as, for example, CVD, thermal or e-beam evaporation and/or sputtering followed by a planarization process, such as, chemical mechanical polishing (CMP), to remove excess chromium 140 after deposition. Other metals known to form silicide by reacting with silicon, such as, e.g. nickel (Ni) and titanium (Ti) may also be used.

Figure 11A:
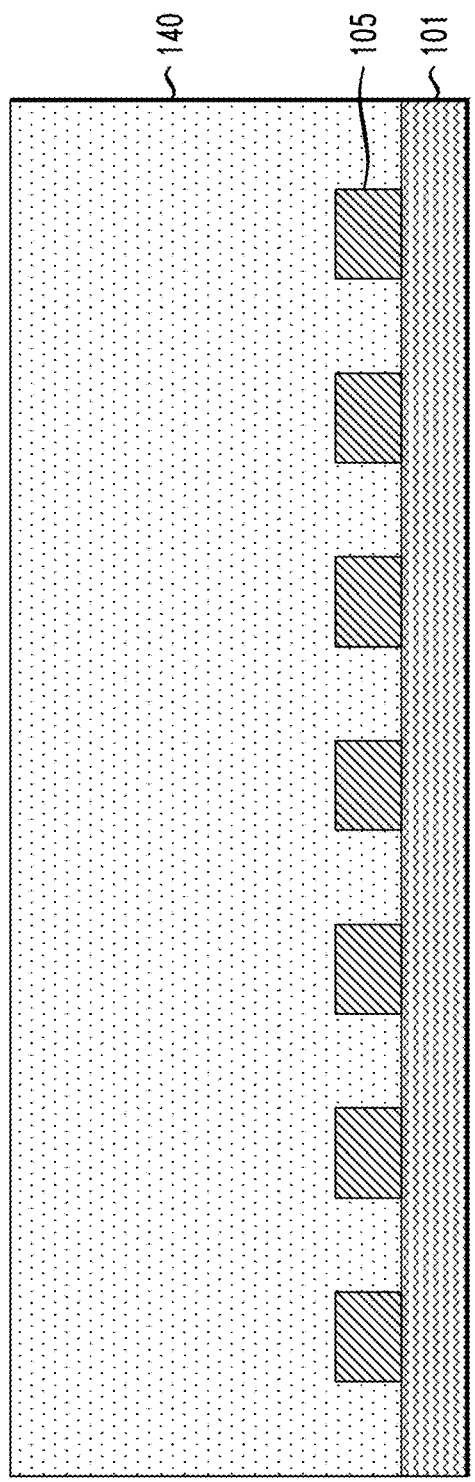
FIGS. 11A and 11B are schematic cross-sectional views showing the formation of silicide, according to an embodiment of the invention.
Figure 11B:
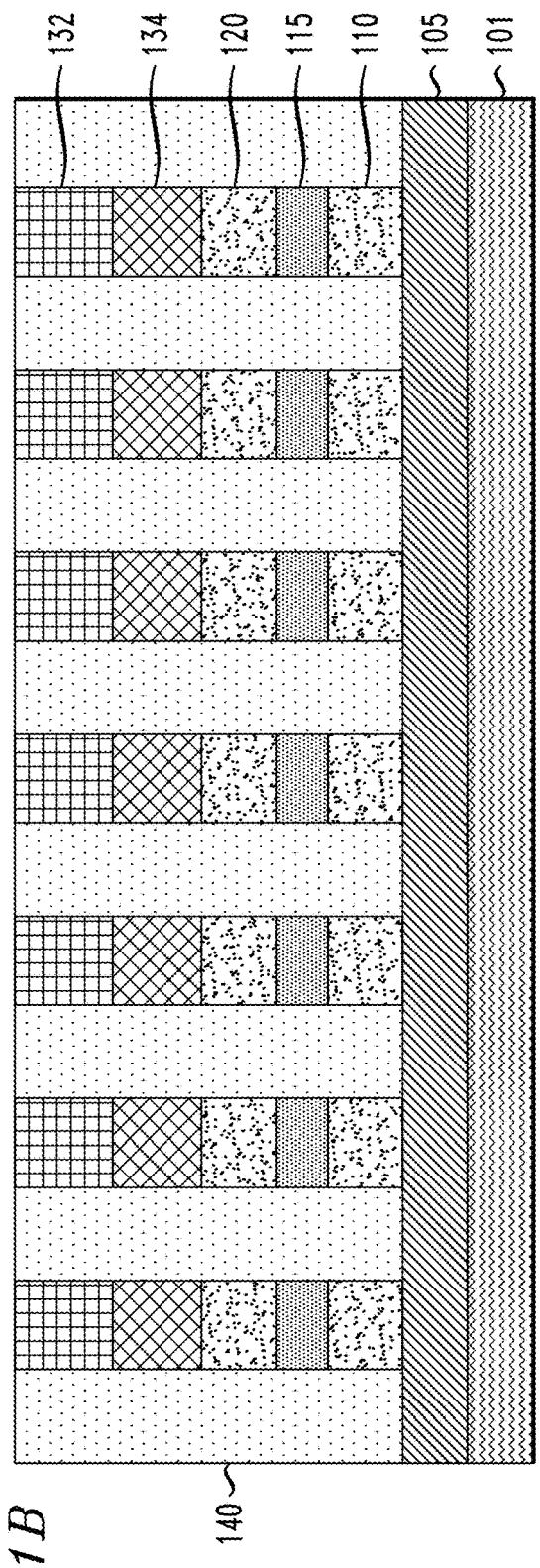

FIGS. 11A and 11B are schematic cross-sectional views showing the formation of silicide, according to an embodiment of the invention. Specifically, FIGS. 11A and 11B depict the formation of a silicide (chromium silicide (CrSi)) 134 on top of the polysilicon 110/115/120 stack. In at least one embodiment of the invention, the silicide 134 may form during Cr deposition (see, e.g., FIGS. 10A-10C) by applying substrate heating, by annealing after deposition, or a combination thereof. Temperatures used for substrate heating and/or post-deposition annealing may be in the range of room-temperature to about 300° C., preferably in the range of 150-200° C. in some embodiments. The relatively low temperature used during this silicide formation step prevents the other layers from becoming silicided (that is, only the a-Si layer 130 is substantially silicided and silicide formation on the polysilicon layers 110/115/120 is negligible).

Figure 12A:
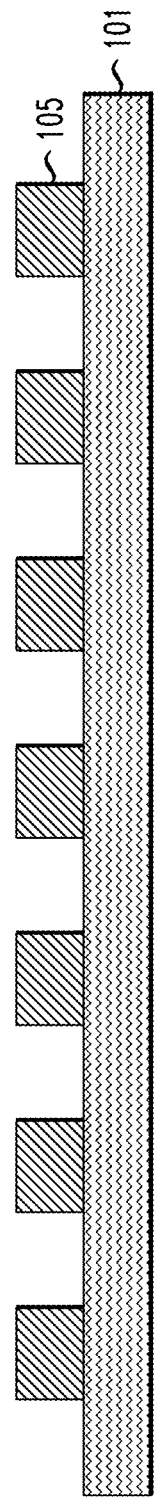
FIGS. 12A and 12B are schematic cross-sectional views showing the etching of chromium, according to an embodiment of the invention.
Figure 12B:
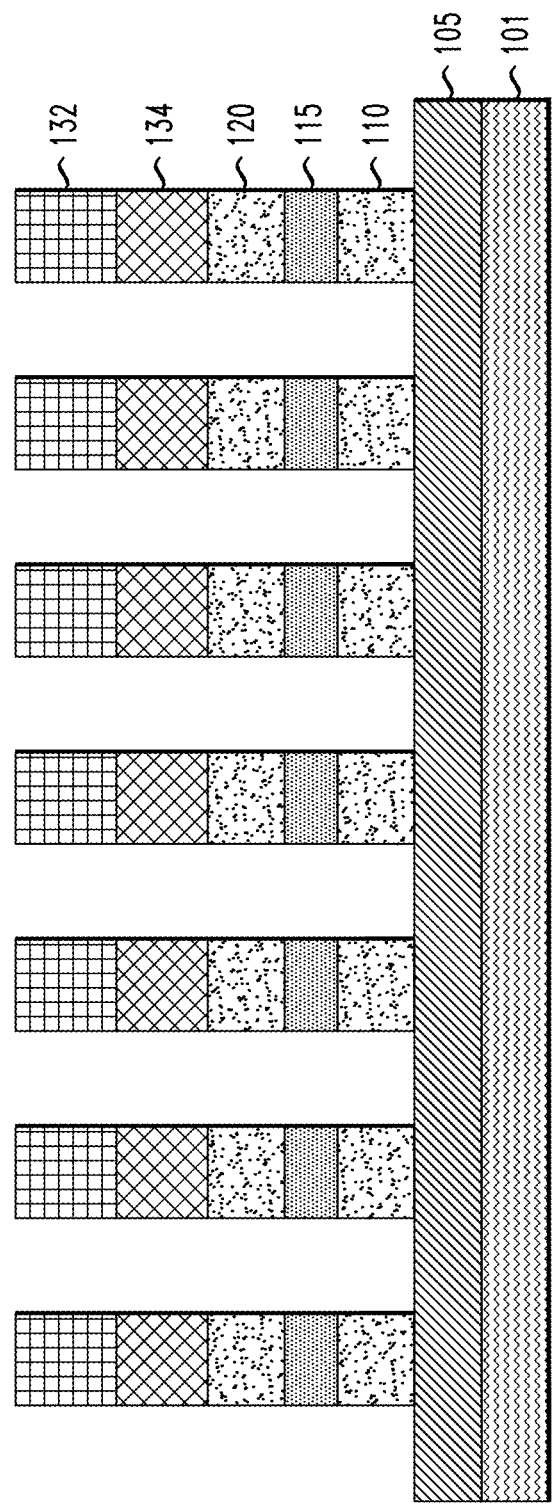

FIGS. 12A and 12B are schematic cross-sectional views showing the etching of chromium, using an etch chemistry that does not attack chromium silicide, according to an embodiment of the invention. In at least one embodiment of the invention, the chromium can be etched, for example, with an aquatic (water-based) solution of ceric ammonium nitrate $[Ce(NH_4)_2(NO_3)_6]$ in perchloric acid $(HClO_4)$.

Figure 13A:
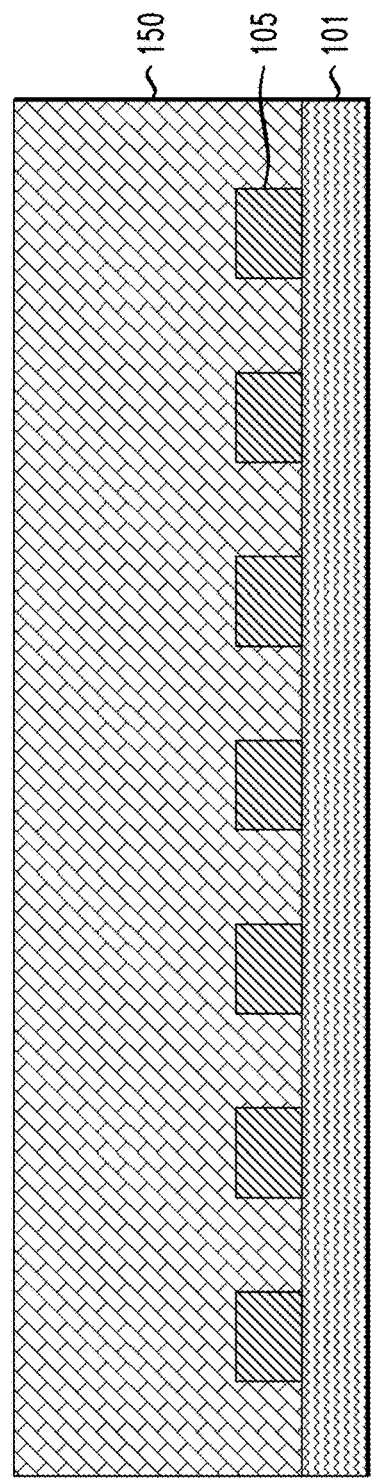
FIGS. 13A and 13B are schematic cross-sectional views showing addition of flowable oxide (FOX), according to an embodiment of the invention.
Figure 13B:
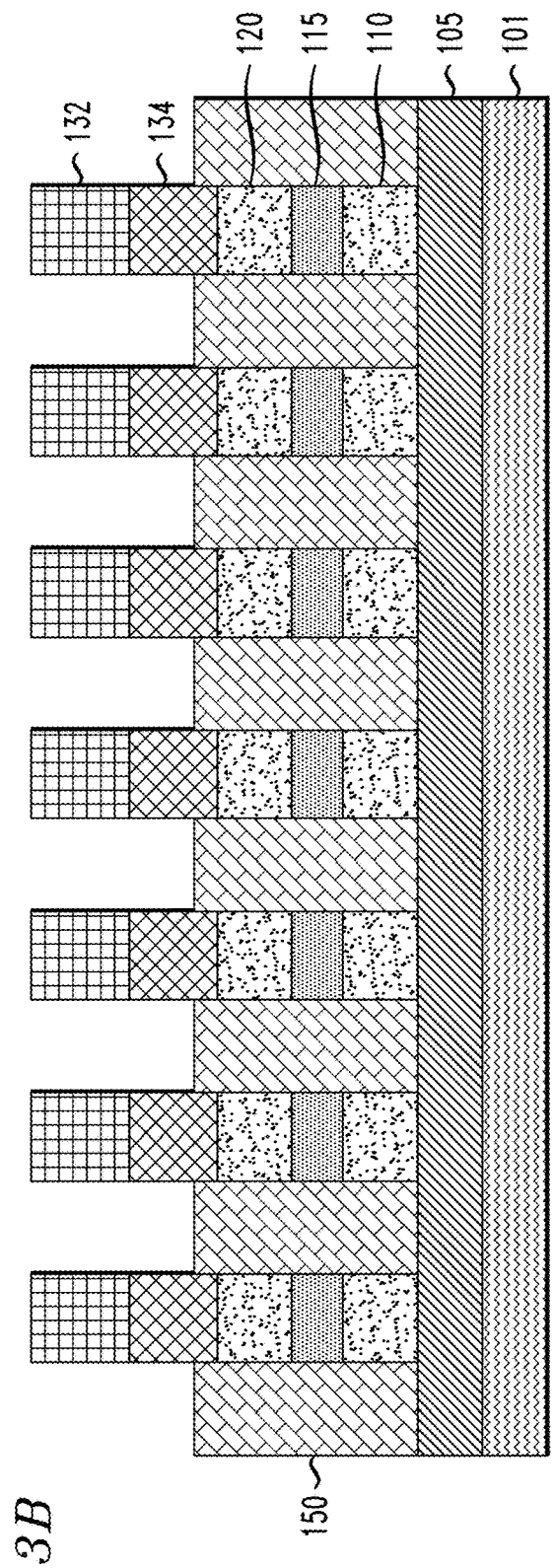

FIGS. 13A and 13B are schematic cross-sectional views showing addition of flowable oxide (FOX) 150, according to an embodiment of the invention. Specifically, at least one embodiment of the invention includes deposition of FOX 150 to a height slightly above the top of the 110/115/120 polysilicon stack, leaving exposed the nitride hard mask 132 and a large portion of the silicide 134 at a height above the FOX 150. This allows trimming the silicide 134 (explained below with reference to FIGS. 14A and 14B) using etch solutions that may potentially damage the polysilicon stack 120/115/110, as the FOX 150 serves to protect the sidewalls of the polysilicon stack 120/115/110. In other embodiments (not shown), the FOX 150 may be deposited to a height below or approximately equal to the top of the 110/115/120 polysilicon stack, leaving exposed the silicide 134 and the nitride mask 132 at a height above the FOX 150. The FOX 150 can be deposited using, for example, standard spin-on glass equipment. It is spin-coated under a wide range of conditions, which will optimize uniformity on complex geometries. After spin-coating, hot plates are used to remove solvent and to melt and flow the film. The melt and flow properties of the material help to provide superior smoothing and gap fill. After flow, the film is cured in a standard quartz diffusion furnace. No etchback is needed.

FIGS. 14A and 14B are schematic cross-sectional views showing trimming of the silicide (CrSi) 134, using an etch chemistry that etches CrSi at sufficiently low (i.e. controllable) etch rates, according to an embodiment of the invention. Specifically, at least one embodiment of the invention can include trimming the silicide (CrSi) 134 with, for example, a water-based solution of ceric ammonium nitrate [$Ce(NH_4)_2(NO_3)_6$] in nitric acid ($HNO_3$) or hydrochloric acid (HCl). Etch rate may be reduced to a desired value by increasing the percentage of deionized water in the etch solution.

Figure 15A:
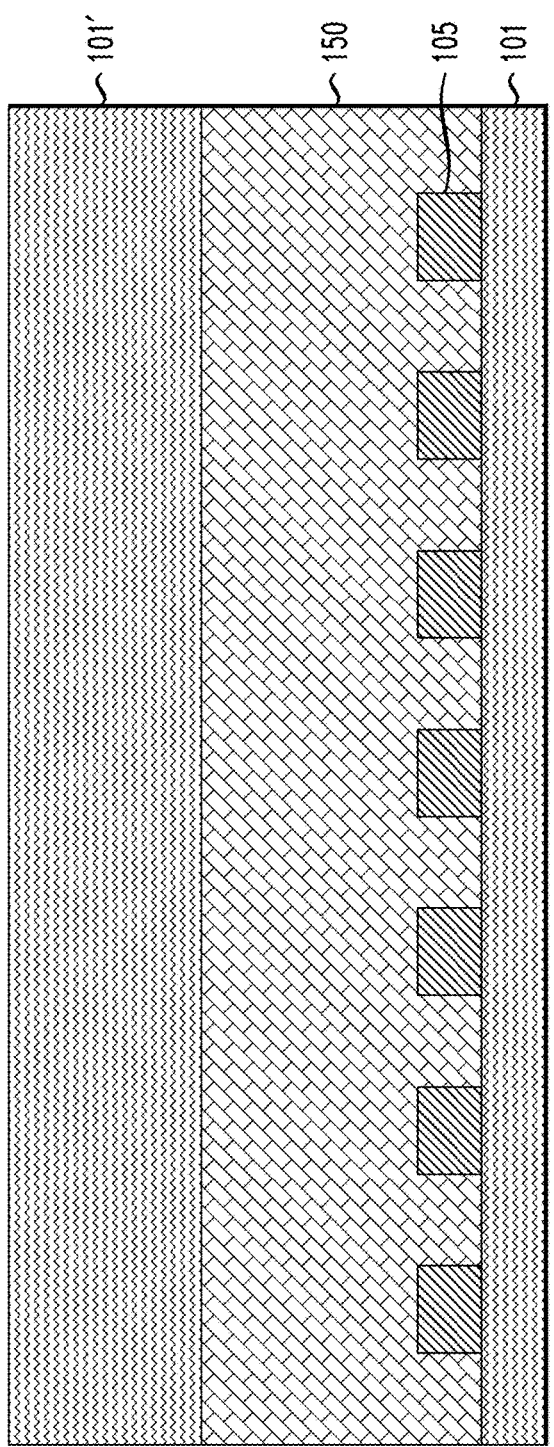
FIGS. 15A and 15B are schematic cross-sectional views showing addition of inter-layer dielectric (ILD), according to an embodiment of the invention.
Figure 15B:
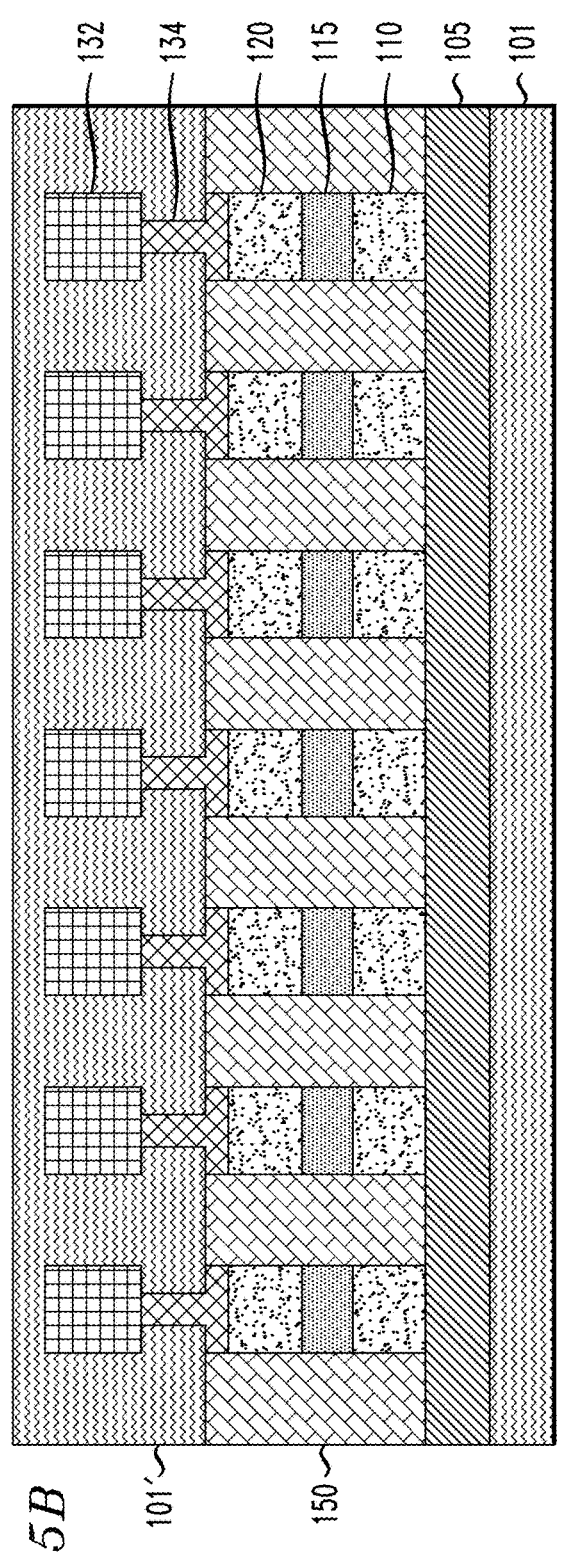

FIGS. 15A and 15B are schematic cross-sectional views showing addition of ILD 101', according to an embodiment of the invention. Specifically, at least one embodiment of the invention includes filling ILD 101' on top of the FOX layer 150. The ILD 101' can be the same or similar material to that of ILD 101, and can be deposited using, for example, CVD, PECVD, RFCVD, PVD, ALD, MLD, MBD, PLD, LSMCD, and/or sputtering, followed by planarization by, for example, CMP.

Figure 16A:
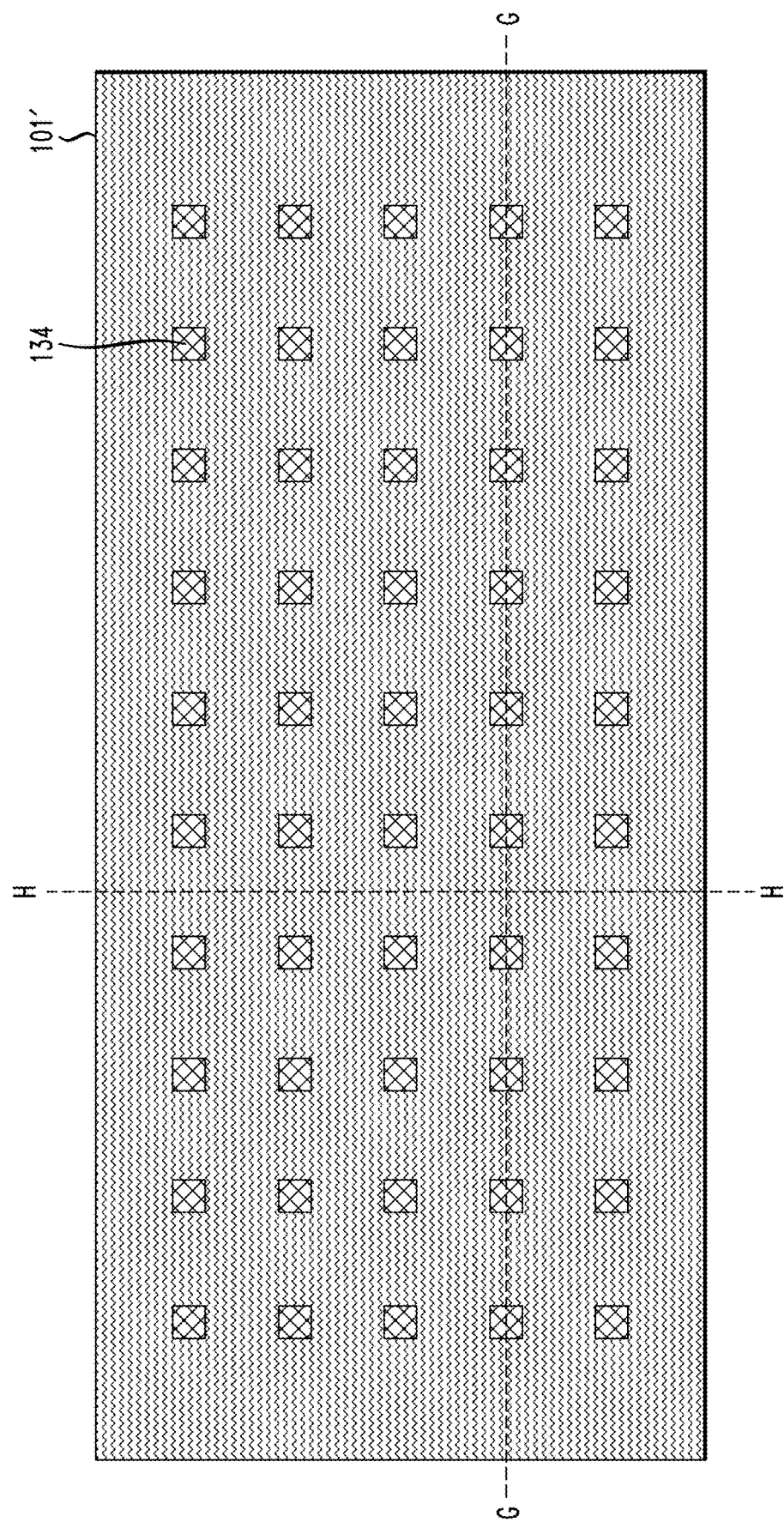
FIG. 16A is a schematic top view illustrating manufacturing of a memory device and showing planarizing, according to an embodiment of the invention.
Figure 16B:
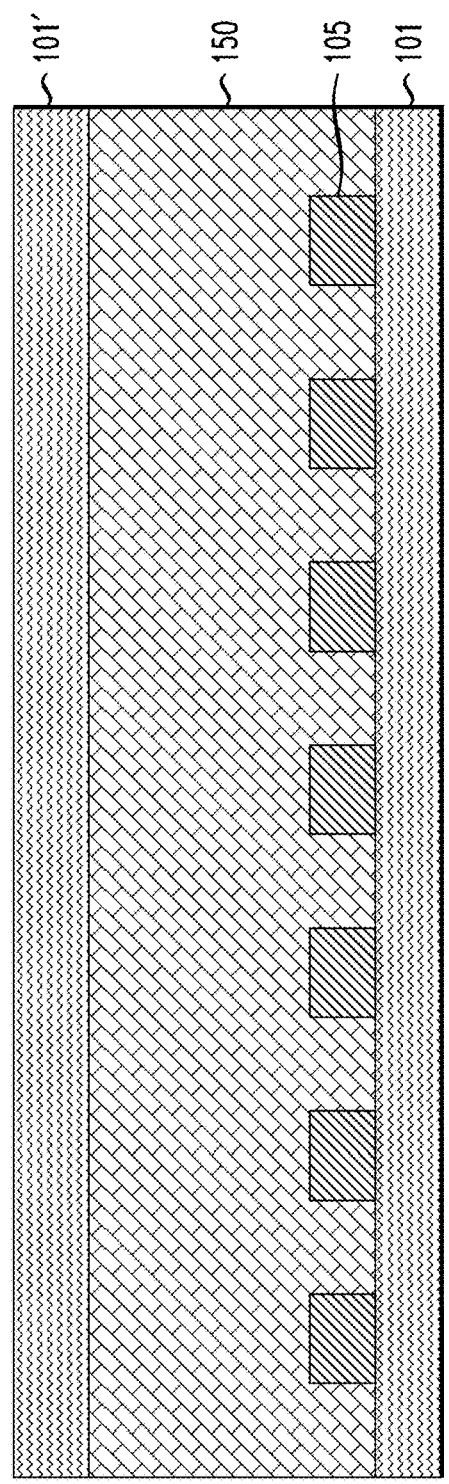
FIGS. 16B and 16C are schematic cross-sectional views showing planarizing, according to an embodiment of the invention.
Figure 16C:
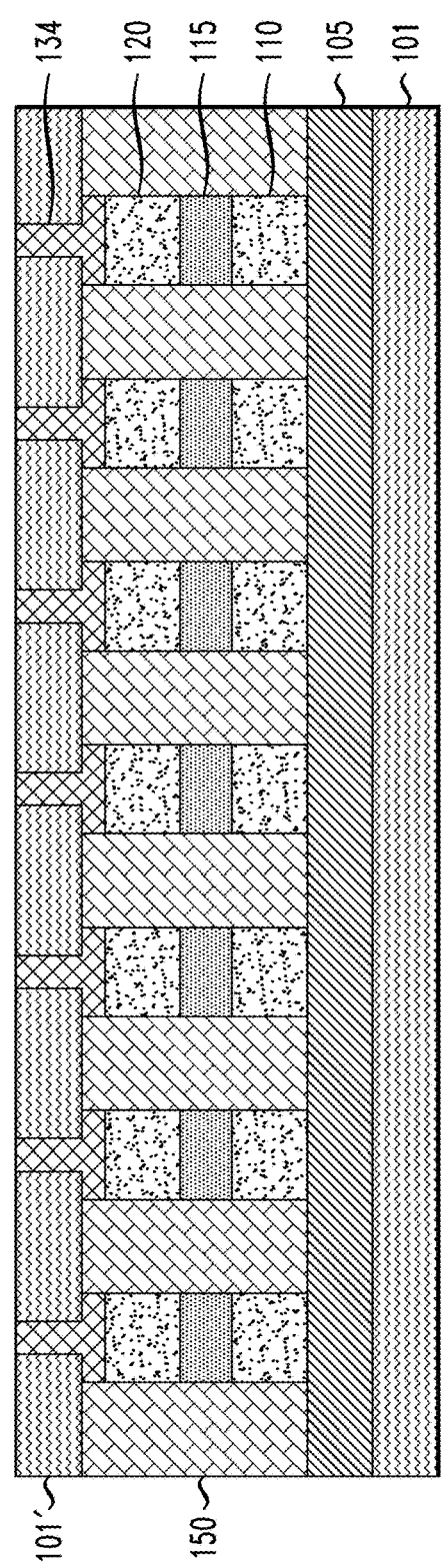

FIG. 16A is a schematic top view and FIGS. 16B and 16C are schematic cross-sectional views illustrating manufacturing of a memory device and showing planarizing the added ILD 101', according to an embodiment of the invention. Specifically, at least one embodiment of the invention includes planarizing (for example, using CMP) the excess portions of the ILD 101 added in FIGS. 15A-15B, as well as using CMP to remove the nitride hard mask 132.

Figure 17A:
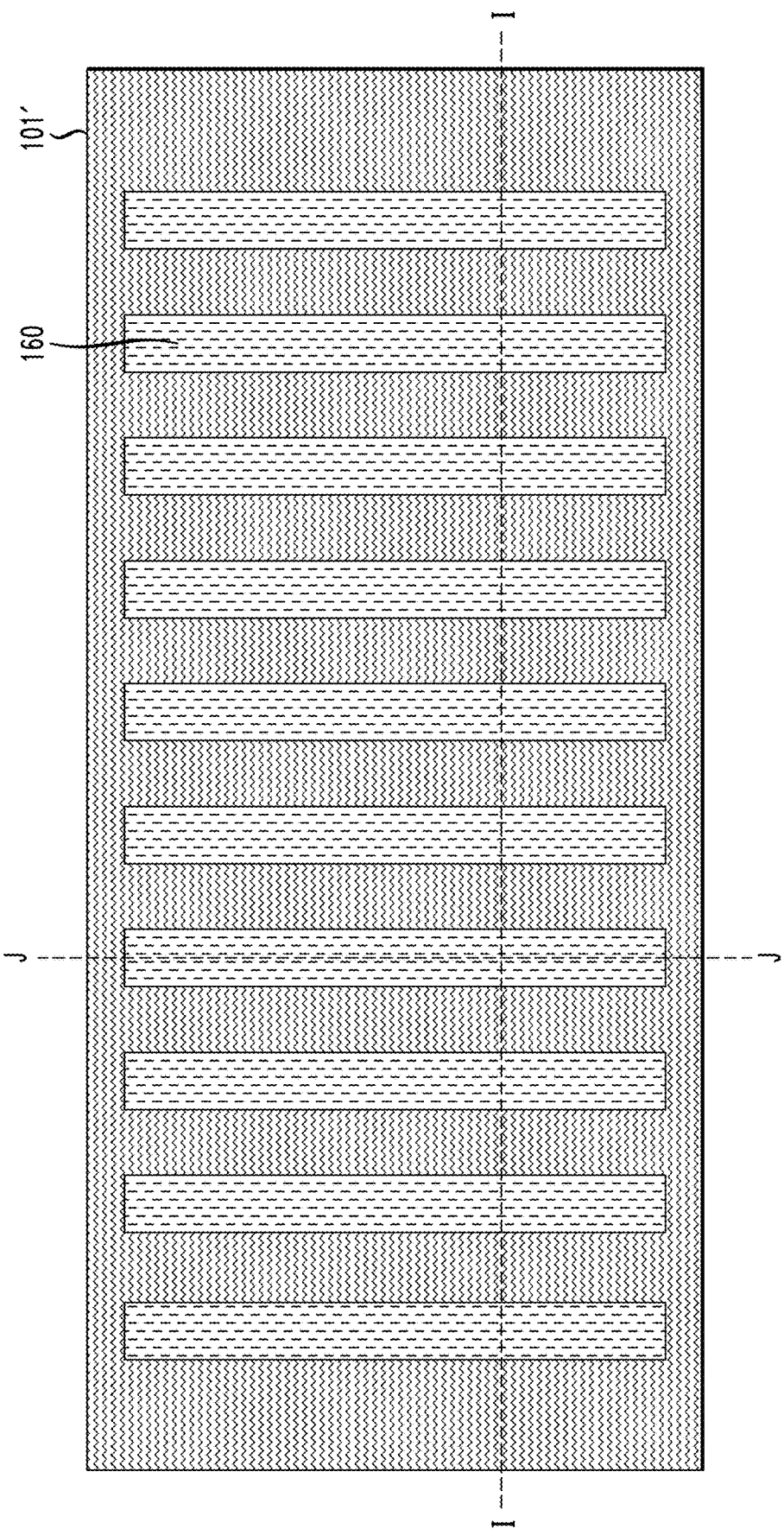
FIG. 17A is a schematic top view illustrating manufacturing of a memory device and showing bit line formation, according to an embodiment of the invention.

FIG. 17A is a schematic top view and FIGS. 17B and 17C are schematic cross-sectional views illustrating manufacturing of a memory device and showing bit line formation, according to an embodiment of the invention. Specifically, in at least one embodiment of the invention, the bit lines 160 are formed on the silicide (CrSi) 134 (and portions of the added ILD 101 proximate thereto). In one or more embodiments of the invention, a plurality of bit lines 160 are formed on the added dielectric layer 101 to be spaced apart from each other in positions corresponding to the stacked structures including layers 134, 120, 115 and 110. The bit lines 160 electrically contact their corresponding silicide layers 134, and the word lines 105 electrically contact the polysilicon layers 110. The bit lines 160 can be oriented to have a length (longer dimension) extension direction which is perpendicular to the length (longer dimension) extension direction of the word lines 105.

The material of the bit lines 160 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bit lines 160 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bit line layer is deposited and then patterned into individual portions that are spaced apart from each other. The bit lines 160 can be patterned to be spaced apart from each other, using, for example, photolithography and reactive ion etching (ME) which may optionally include a dielectric hard mask such as oxide or nitride.

Figure 18:
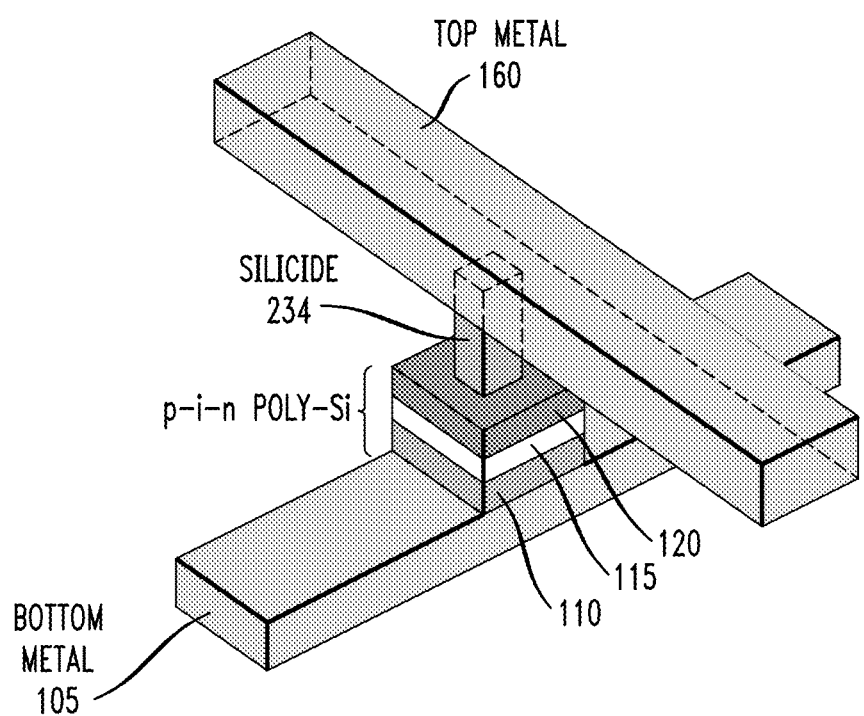
FIG. 18 is a three-dimensional schematic diagram of a memory cell, according to an embodiment of the invention.

FIG. 18 is a three-dimensional schematic diagram of a memory cell 1800, according to an embodiment of the invention. By way of illustration, FIG. 18 depicts a bottom conductive layer (such as, for example, one or more word lines) 105, a first polysilicon layer 110, a second polysilicon layer 115, a third polysilicon layer 120, a trimmed silicide 234, and a top conductive layer (such as, for example, one or more bit lines) 160. As described with reference to FIG. 1, the depicted geometry of the trimmed silicide 234 which has a rectangular cross-section is illustrative and the trimmed silicide 234 may have a circular cross-section or a rectangular cross-section with rounded edges, in some embodiments. Moreover, the cross-section of the trimmed silicide 234 may vary along its height. For instance, the trimmed silicide 234 may have a smaller cross section area at its middle compared to its top and bottom. As further detailed below, FIGS. 19-26 depict an example method of forming a plurality of memory cells 1800 (and the steps detailed in FIGS. 2-9 are also applicable in forming memory cells 1800).

Figure 19A:
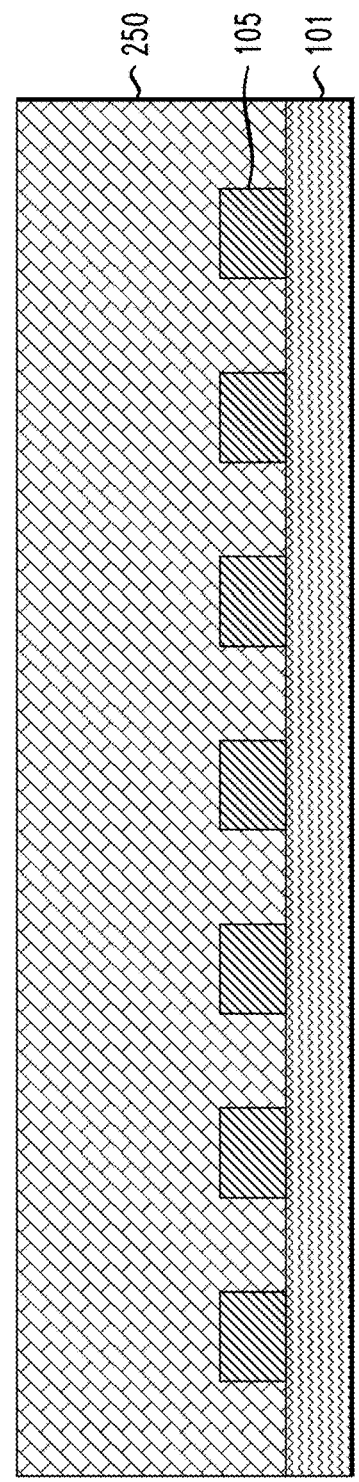
FIGS. 19A and 19B are schematic cross-sectional views showing addition of FOX, according to an embodiment of the invention.
Figure 19B:
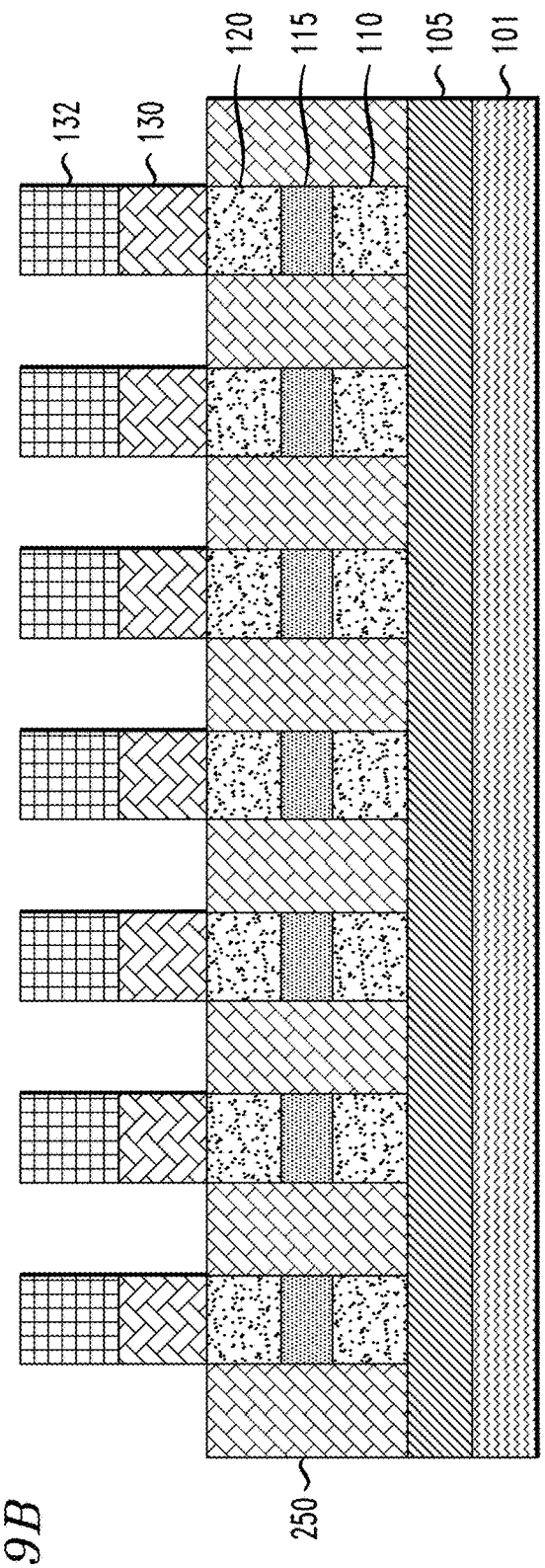

FIGS. 19A and 19B are schematic cross-sectional views showing addition of FOX 250, according to an embodiment of the invention. Specifically, FIGS. 19A and 19B depict deposition of FOX 250 to the top or approximately the top of the 110/115/120 polysilicon stack, leaving the a-Si layer 130 and the nitride hard mask 132 at a height above the FOX layer 250. The FOX layer 250 can be deposited using, for example, CVD, PECVD, RFCVD, PVD, ALD, MLD, MBD, PLD, LSMCD, and/or sputtering.

Figure 20A:
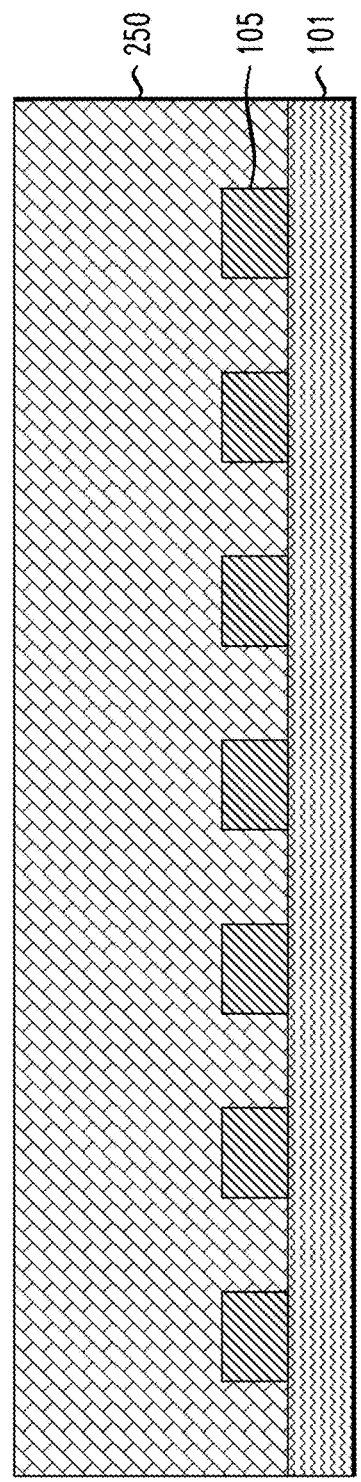
FIGS. 20A and 20B are schematic cross-sectional views showing trimming of a-Si, according to an embodiment of the invention.
Figure 20B:
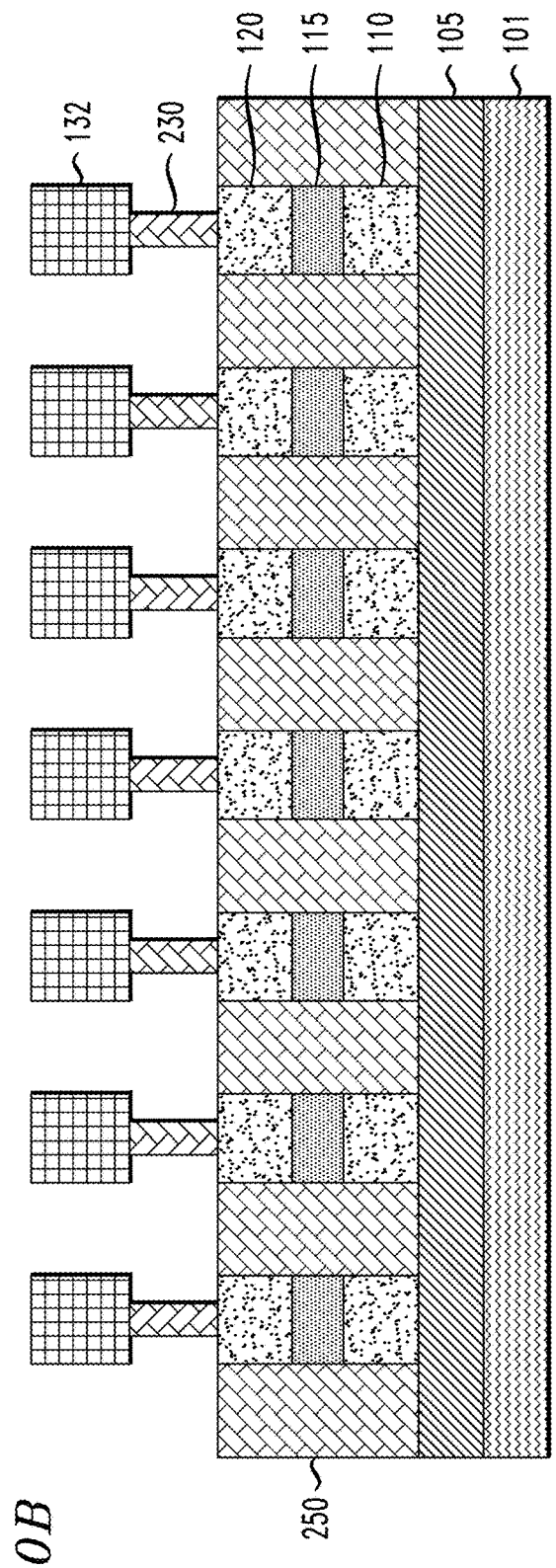

FIGS. 20A and 20B are schematic cross-sectional views showing trimming of a-Si, using an etch chemistry that does not attack polysilicon, according to an embodiment of the invention. Specifically, at least one embodiment of the invention can include selectively trimming the a-Si layer 130 using, for example, diluted KOH solution (e.g., 1M in deionized water (DIW)) to result in trimmed a-Si layers 230.

Figure 21A:
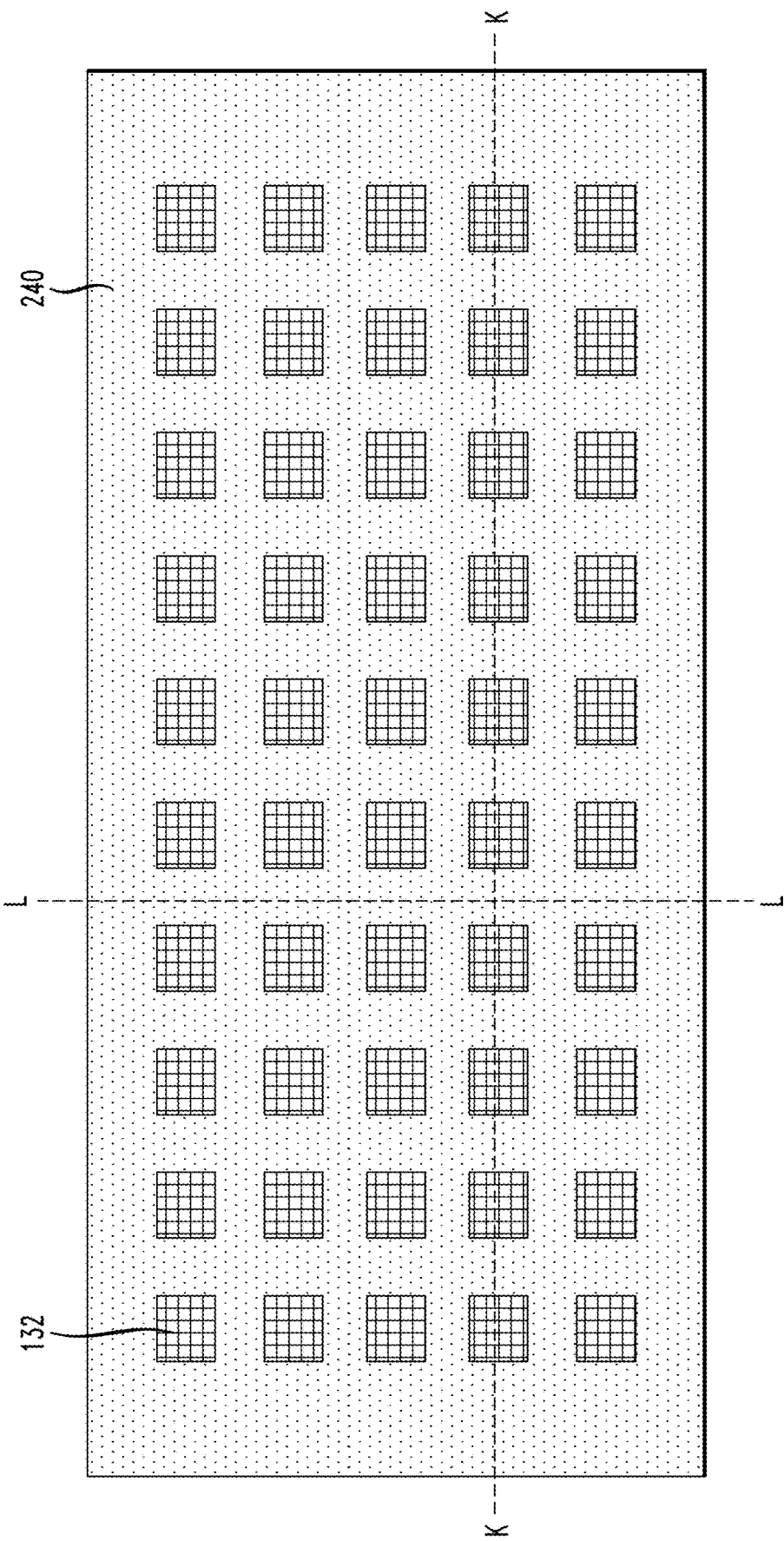
FIG. 21A is a schematic top view illustrating manufacturing of a memory device and showing deposition of chromium, according to an embodiment of the invention.
Figure 21B:
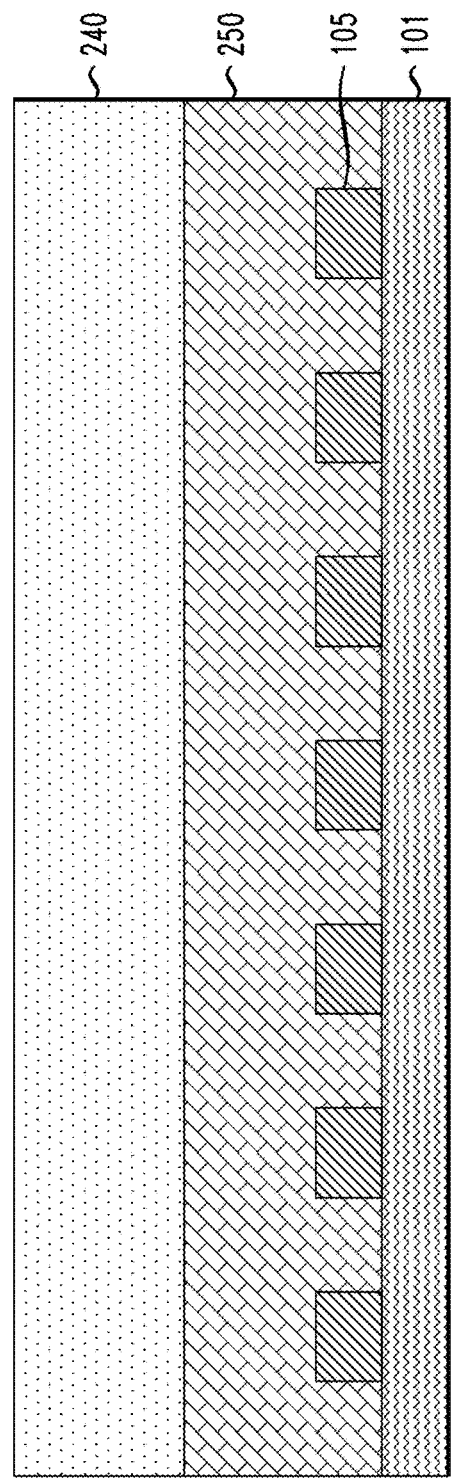
FIGS. 21B and 21C are schematic cross-sectional views showing deposition of chromium, according to an embodiment of the invention.
Figure 21C:
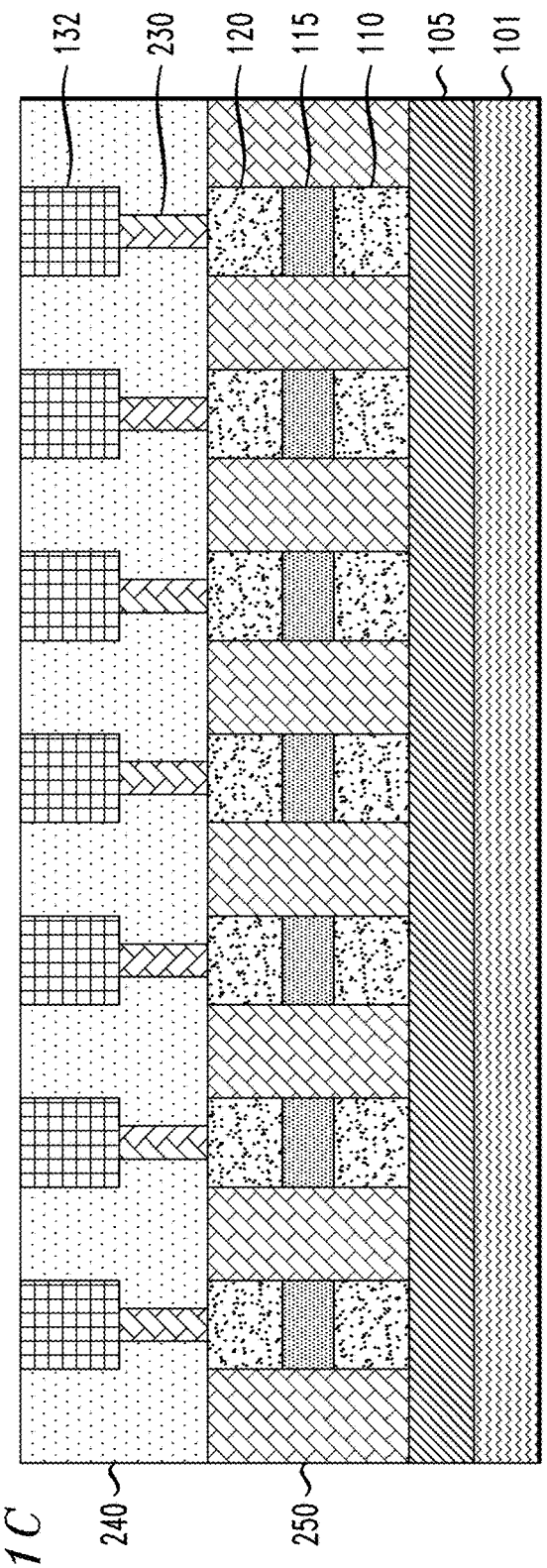

FIG. 21A is a schematic top view and FIGS. 21B and 21C are schematic cross-sectional views illustrating manufacturing of a memory device and showing deposition of chromium 240, according to an embodiment of the invention. Referring to FIGS. 21A-21C, the deposition of chromium 240 on top of the FOX layer 250 can be performed using deposition techniques, such as, for example, CVD, PECVD, RFCVD, HWCVD, PVD, ALD, MLD, MBD, PLD, LSMCD, and/or sputtering followed by a followed by a planarization process, such as, CMP, to remove excess chromium 240 after deposition.

Figure 22A:
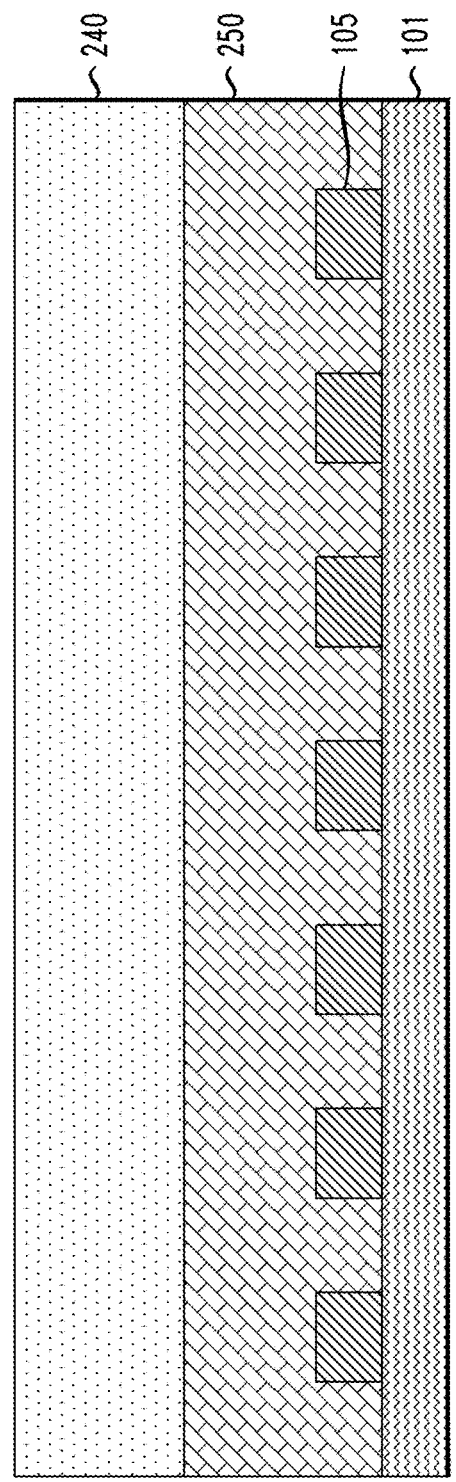
FIGS. 22A and 22B are schematic cross-sectional views showing the formation of silicide, according to an embodiment of the invention.
Figure 22B:
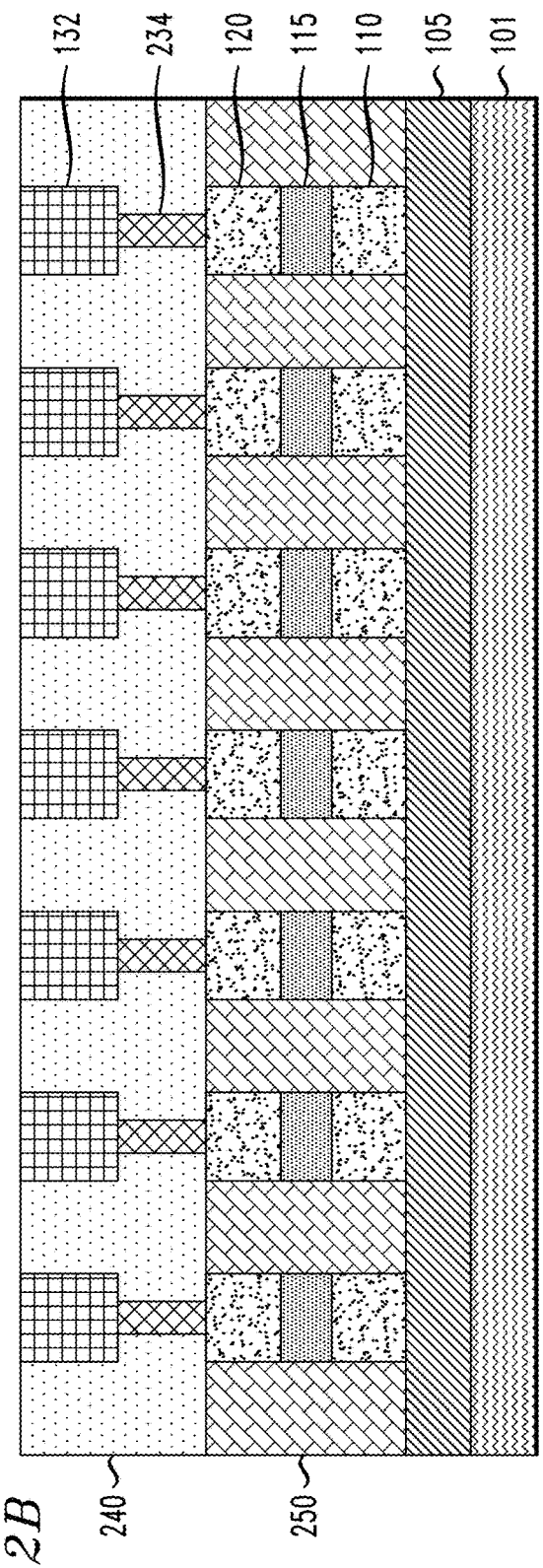

FIGS. 22A and 22B are schematic cross-sectional views showing the formation of silicide, according to an embodiment of the invention. Specifically, similar to the description in connection with FIGS. 11A and 11B, FIGS. 22A and 22B depict the formation of a silicide (CrSi) 234 on top of the polysilicon 110/115/120 stack. In at least one embodiment of the invention, the silicide 234 may form during Cr deposition (see, e.g., FIGS. 21A-21C) by applying substrate heating, by annealing after deposition, or a combination thereof. Temperatures used for substrate heating and/or post-deposition annealing may be in the range of room-temperature to about 300° C., preferably in the range of 150–200° C. in some embodiments. As noted herein, the relatively low temperature used during this silicide formation step prevents the other layers from becoming silicided (that is, only the a-Si layer 230 is silicided).

FIGS. 23A and 23B are schematic cross-sectional views showing the etching of chromium, according to an embodiment of the invention. In at least one embodiment of the invention, the chromium can be etched, for example, with ceric ammonium nitrate $[Ce(NH_4)_2(NO_3)_6]$ in perchloric acid $(HClO_4)$.

Similar to the description in connection with FIGS. 15A and 15B, FIGS. 24A and 24B are schematic cross-sectional views showing addition of ILD 101', according to an embodiment of the invention. Specifically, at least one embodiment of the invention includes filling ILD 101' on top of the FOX layer 250.

Figure 25A:
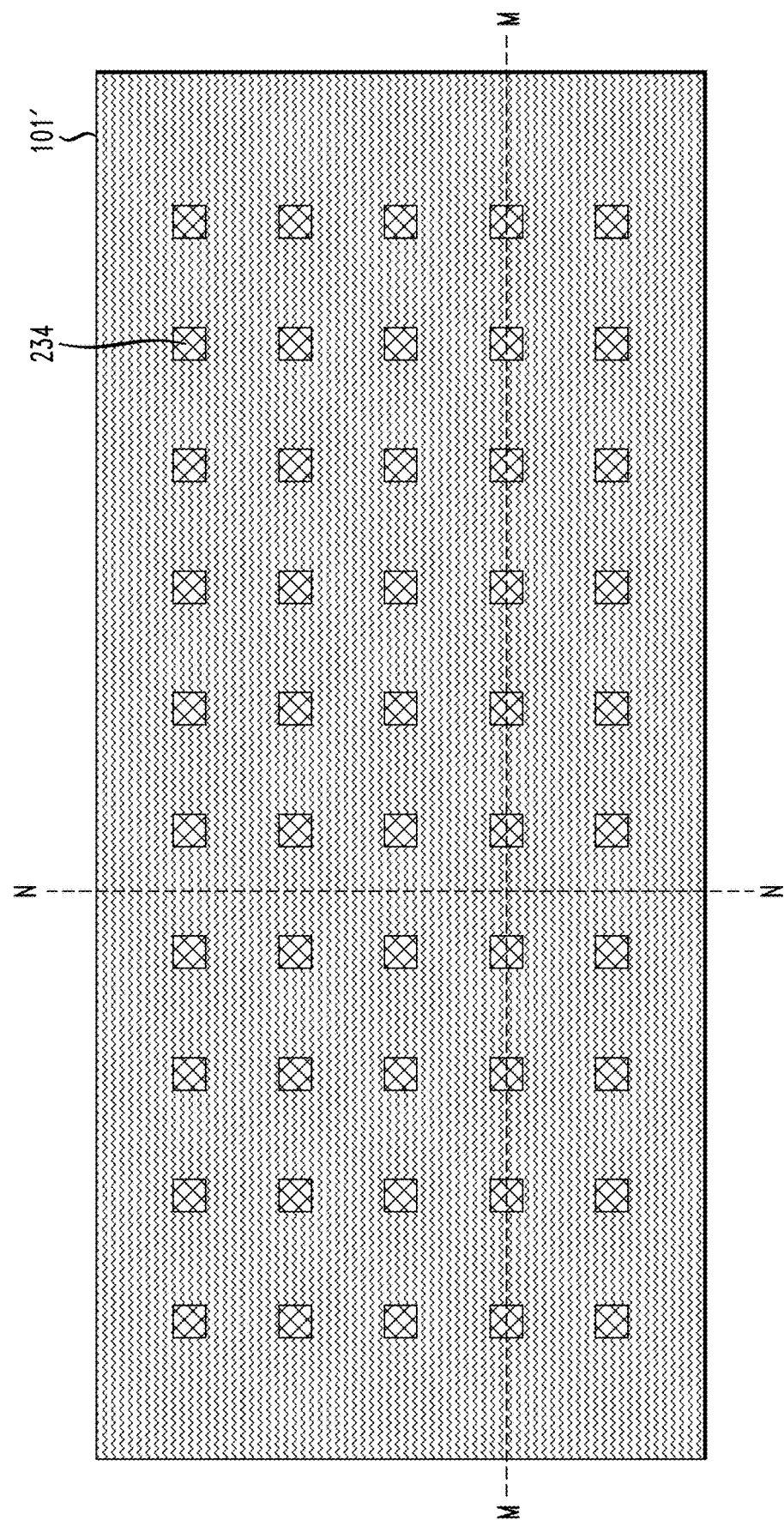
FIG. 25A is a schematic top view illustrating manufacturing of a memory device and showing planarizing, according to an embodiment of the invention.
Figure 25B:
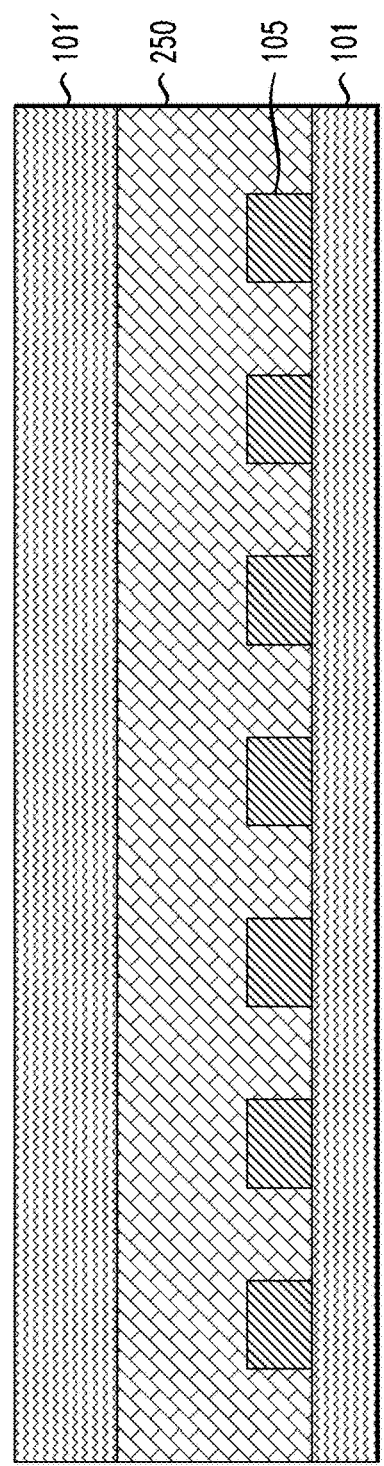
FIGS. 25B and 25C are schematic cross-sectional views showing planarizing, according to an embodiment of the invention.
Figure 25C:
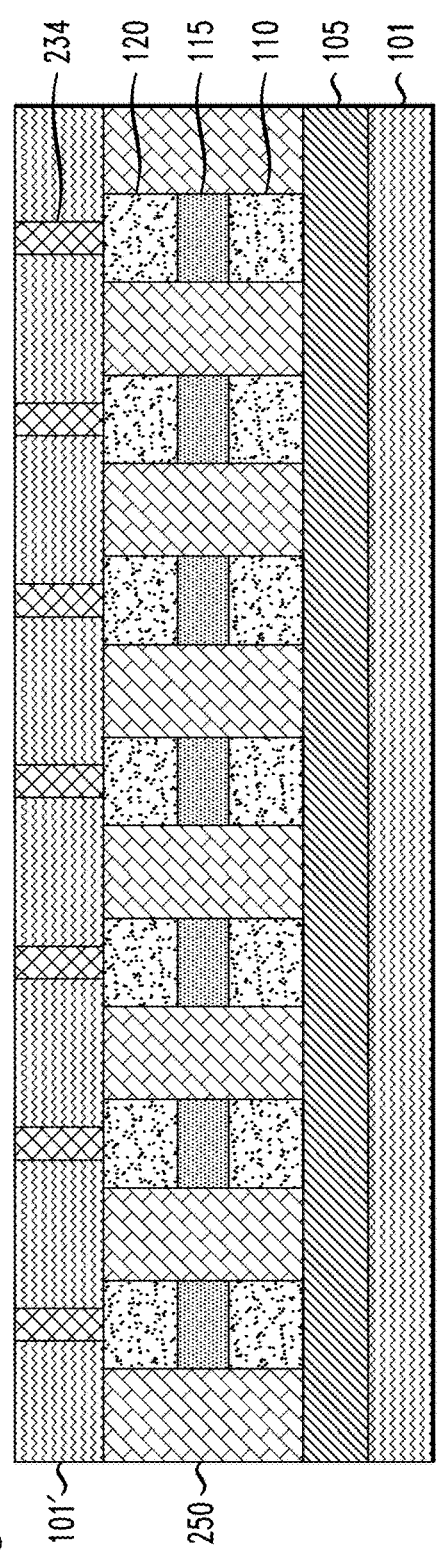

FIG. 25A is a schematic top view and FIGS. 25B and 25C are schematic cross-sectional views illustrating manufacturing of a memory device and showing planarizing, according to an embodiment of the invention. Specifically, at least one embodiment of the invention includes planarizing (for example, using CMP) the excess portions of the ILD 101' added in FIGS. 24A-24B, as well as using CMP to remove the nitride hard mask 132.

Figure 26B:
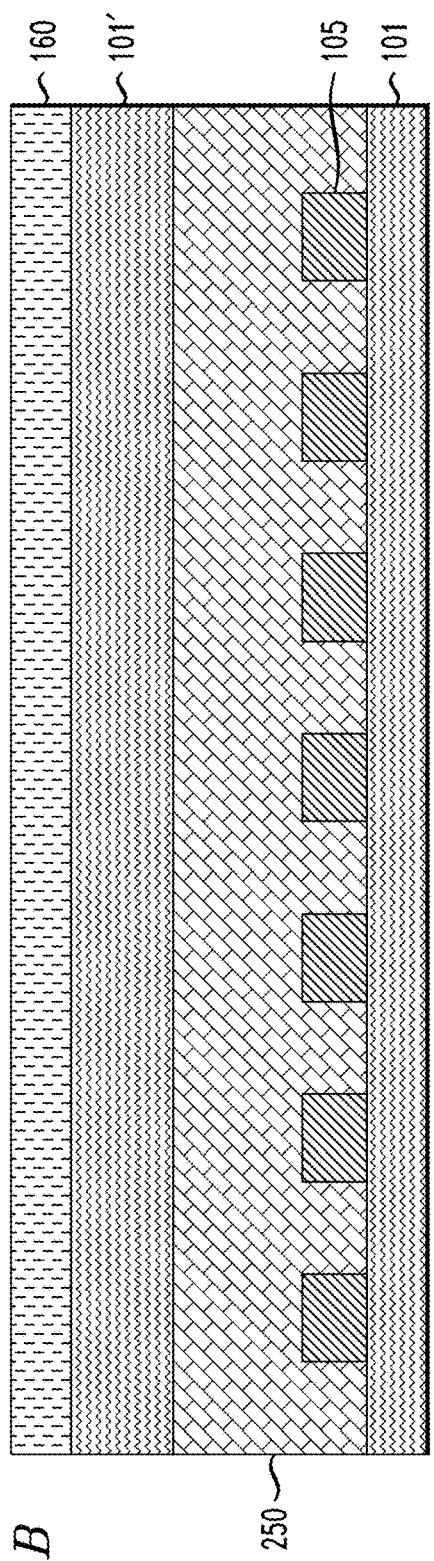
FIGS. 26B and 26C are schematic cross-sectional views showing bit line formation, according to an embodiment of the invention.
Figure 26C:
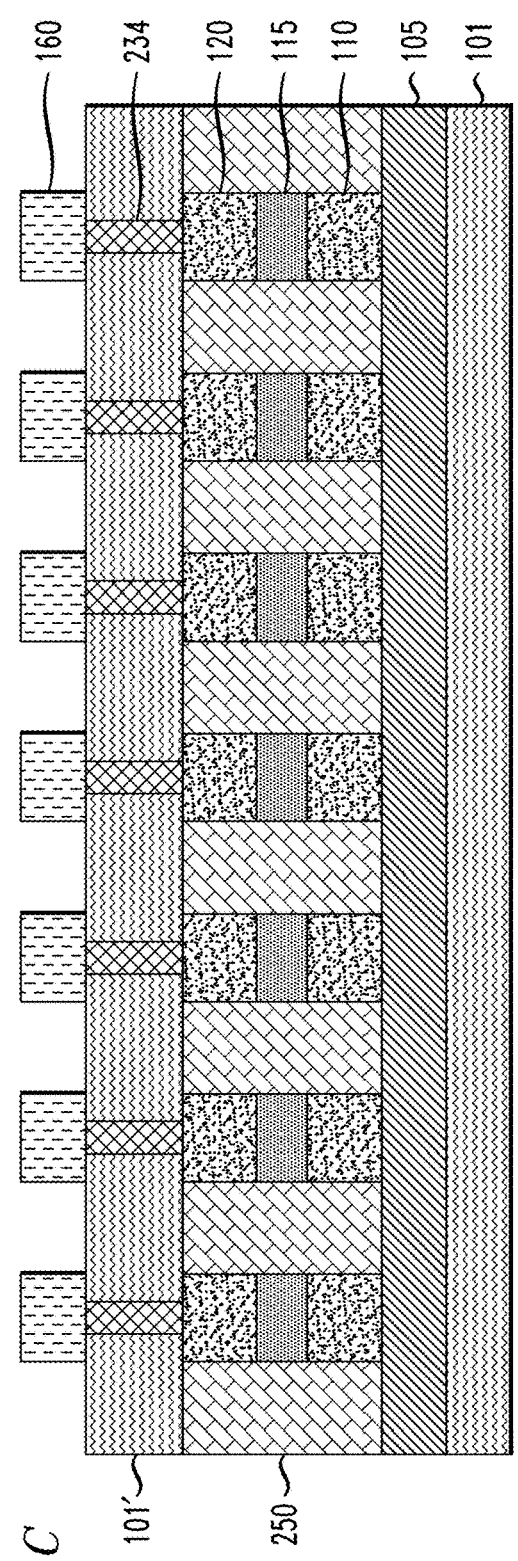

Similar to the description in connection with FIGS. 17A-17C, FIG. 26A is a schematic top view and FIGS. 26B and 26C are schematic cross-sectional views illustrating manufacturing of a memory device and showing formation of bitlines, according to an embodiment of the invention. Specifically, in at least one embodiment of the invention, the bit lines 160 are formed on the silicide (CrSi) 234 (and portions of the added ILD 101' proximate thereto). In one or more embodiments of the invention, a plurality of bit lines 160 are formed on the added dielectric layer 101' to be spaced apart from each other in positions corresponding to the stacked structures including layers 234, 120, 115 and 110.

As detailed herein, the bit lines 160 electrically contact their corresponding silicide layers 234, and the word lines 105 electrically contact the polysilicon layers 110. The bit lines 160 can be oriented to have a length (longer dimension) extension direction which is perpendicular to the length (longer dimension) extension direction of the word lines 105.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for manufacturing a semiconductor memory device, comprising:
   forming a first silicon layer on a bottom conductive layer;
   transforming the first silicon layer into a first polysilicon layer;
   forming a second silicon layer stacked on the first polysilicon layer, and a third silicon layer stacked on the second silicon layer;
   transforming the second and third silicon layers into second and third polysilicon layers;
   wherein the first polysilicon layer has a first doping type, and the third polysilicon layer has a second doping type different from the first doping type;
   forming an amorphous silicon layer on the third polysilicon layer;
   forming the amorphous silicon layer into a silicide layer;
   depositing an oxide onto at least a portion of the first, second, and third polysilicon layers, and on a lower portion of the silicide layer;
   wherein a hardmask covers a top surface of the silicide layer;
   selectively trimming an exposed portion of the silicide layer to form a silicide fuse by laterally etching sidewall portions of the exposed portion of the silicide layer under the hardmask to a reduced dimension;
   wherein a lateral width of the trimmed portion of the silicide layer is less than a lateral width of the lower portion of the silicide layer on which the oxide is deposited;
   removing the hardmask after the selectively trimming; and
   forming a top conductive layer on at least a portion of the silicide fuse after the removing of the hardmask.

2. The method according to claim 1, further comprising forming the hardmask on the amorphous silicon layer prior to forming the amorphous silicon layer into a silicide layer.

3. The method according to claim 1, wherein the transforming of the first, second and third silicon layers is performed using a laser annealing process.

4. The method according to claim 1, wherein the first, second and third silicon layers comprise at least one of amorphous silicon, nano-crystalline silicon and micro-crystalline silicon.

5. The method according to claim 1, further comprising planarizing the first polysilicon layer in order to remove one or more surface protrusions formed on the first polysilicon layer as a result of the transforming of the first silicon layer.

6. The method according to claim 1, wherein forming the second and third silicon layers comprises epitaxially growing the second and third silicon layers.

7. The method according to claim 1, further comprising:
   patterning the bottom conductive layer into a plurality of word lines; and
   patterning the top conductive layer into a plurality of bit lines;
   wherein the plurality of bit lines are oriented perpendicularly with respect to the plurality of word lines.

8. The method according to claim 1, further comprising patterning a stacked structure of the amorphous silicon layer and the first, second and third polysilicon layers on the bottom conductive layer into a plurality of stacked structures spaced apart from each other.

9. The method according to claim 1, wherein the forming of the amorphous silicon layer into the silicide layer comprises:
   depositing a metal onto at least a portion of the first, second, and third polysilicon layers and amorphous silicon layer; and
   transforming the amorphous silicon layer into the silicide layer during deposition of the metal.

10. The method according to claim 9, wherein the metal comprises chromium.

11. The method according to claim 1, wherein the forming of the amorphous silicon layer into the silicide layer comprises:
- depositing chromium onto at least a portion of the first, second, and third polysilicon layers and amorphous silicon layer; and
- annealing the deposited chromium and the amorphous silicon layer.

12. The method according to claim 11, wherein the annealing is performed at approximately 150 degrees Celsius to about 200 degrees Celsius.

13. The method according to claim 1, wherein the selective trimming of the exposed portion of the silicide layer is performed using a ceric ammonium nitrate solution.

* * * * *